(12) United States Patent
Shikata et al.

(10) Patent No.: US 11,664,076 B2
(45) Date of Patent: May 30, 2023

(54) MEMORY DEVICE INCLUDING VOLTAGE CONTROL FOR DIFFUSION REGIONS ASSOCIATED WITH MEMORY BLOCKS

(71) Applicant: Micron Technology, Inc., Boise, ID (US)

(72) Inventors: Go Shikata, San Jose, CA (US); Shigekazu Yamada, Suginamiku (JP)

(73) Assignee: Micron Technology, Inc., Boise, ID (US)

( * ) Notice: Subject to any disclaimer, the term of this patent is extended or adjusted under 35 U.S.C. 154(b) by 31 days.

(21) Appl. No.: 17/217,014

(22) Filed: Mar. 30, 2021

(65) Prior Publication Data

US 2022/0208274 A1 Jun. 30, 2022

Related U.S. Application Data

(60) Provisional application No. 63/132,728, filed on Dec. 31, 2020.

(51) Int. Cl.
*G11C 11/56* (2006.01)
*G11C 16/16* (2006.01)
*G11C 16/30* (2006.01)

(52) U.S. Cl.
CPC .............. *G11C 16/16* (2013.01); *G11C 16/30* (2013.01)

(58) Field of Classification Search
CPC ..... G11C 16/16; G11C 16/30; G11C 11/5628; G11C 16/0483; G11C 16/10; G11C 16/3427; G11C 16/3459; G11C 16/08
See application file for complete search history.

(56) References Cited

U.S. PATENT DOCUMENTS

| 5,830,790 A * | 11/1998 | Kim ................ H01L 21/823412 |
| | | 257/E27.06 |
| 2005/0265109 A1* | 12/2005 | Goda ...................... G11C 16/10 |
| | | 257/E27.103 |
| 2008/0094900 A1* | 4/2008 | Nakamura ........ H01L 27/11519 |
| | | 365/185.11 |
| 2016/0118128 A1* | 4/2016 | Hsiung .................. G11C 16/10 |
| | | 365/185.24 |
| 2018/0040378 A1* | 2/2018 | Lee .......................... G11C 8/14 |
| 2018/0182461 A1* | 6/2018 | Lee .......................... G11C 8/08 |
| 2019/0287635 A1* | 9/2019 | Lee ....................... G11C 16/349 |

* cited by examiner

*Primary Examiner* — Jay W. Radke
(74) *Attorney, Agent, or Firm* — Schwegman Lundberg & Woessner, P.A.

(57) ABSTRACT

Some embodiments include apparatuses and methods of operating the apparatuses. One of the apparatuses includes a first memory block including first word lines for respective first memory cells of the first memory block; a second memory block including second word lines for respective second memory cells of the second memory block; first diffusion regions coupled to the first word lines; second diffusion regions adjacent the first diffusion regions, the second diffusion regions coupled to the second word lines; and a circuit to apply a voltage to the second diffusion regions in a write operation performed on the first memory block.

18 Claims, 14 Drawing Sheets

US 11,664,076 B2

1

MEMORY DEVICE INCLUDING VOLTAGE CONTROL FOR DIFFUSION REGIONS ASSOCIATED WITH MEMORY BLOCKS

PRIORITY APPLICATION

This application claims the benefit of priority to U.S. Provisional Application Ser. No. 63/132,728, filed Dec. 31, 2020, which is incorporated herein by reference in its entirety.

TECHNICAL FIELD

Embodiments described herein relate to memory devices including driver circuits associated with memory blocks of the memory devices.

BACKGROUND

Memory devices are widely used in computers and many other electronic items. A memory device usually has numerous memory cells used to store information (e.g., data). Many conventional techniques try to increase memory cell density of the memory device by stacking decks of memory cells vertically for a given area of memory device. However, constraints in fabrication process can limit the vertical dimension of the memory device.

2

Figure 5:
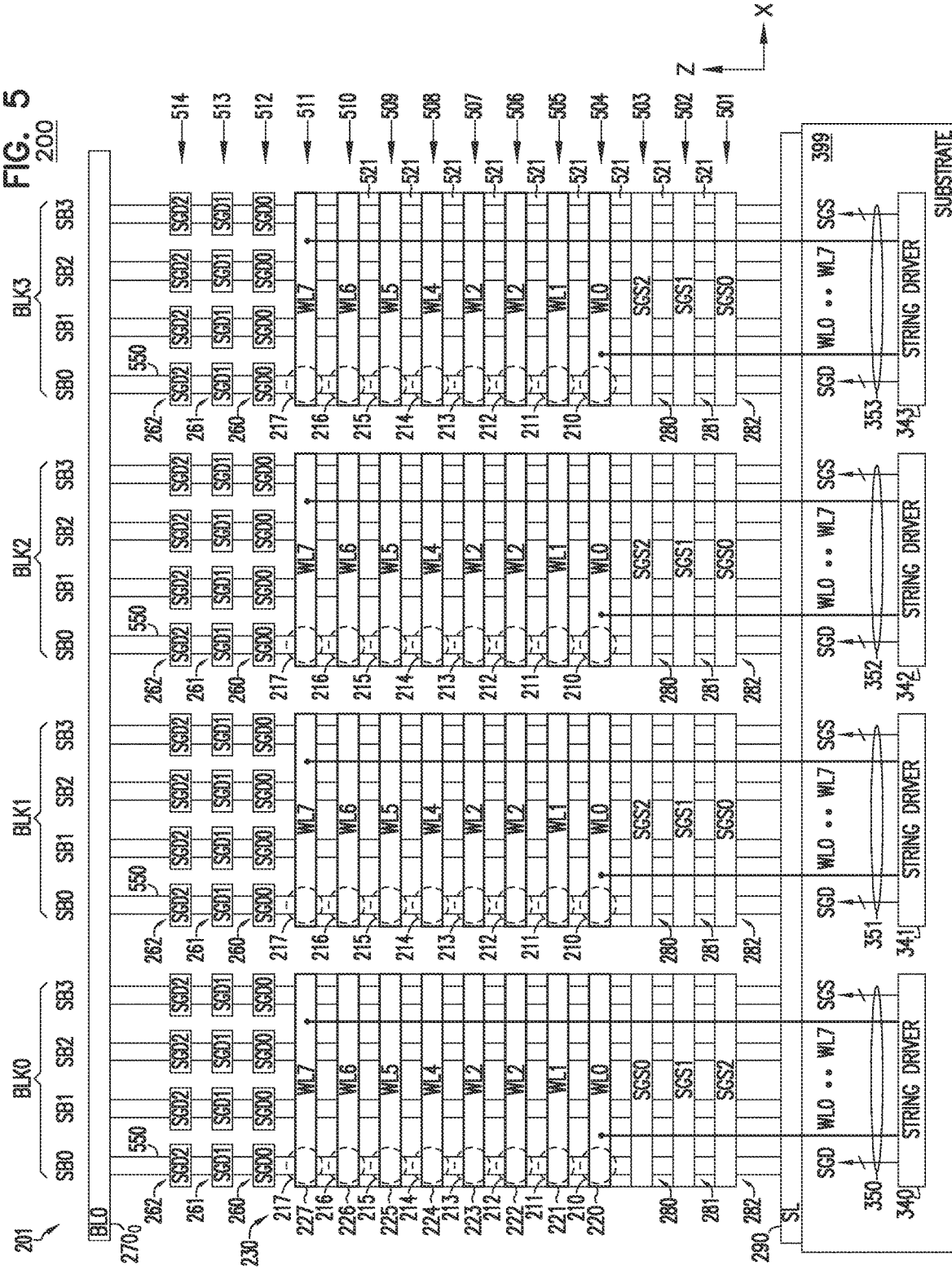
FIG. 5 shows a side view (e.g., cross-section) of a structure of a portion of the memory device of FIG. 3, including the memory blocks associated with the string drivers, according to some embodiments described herein.
Figure 6:
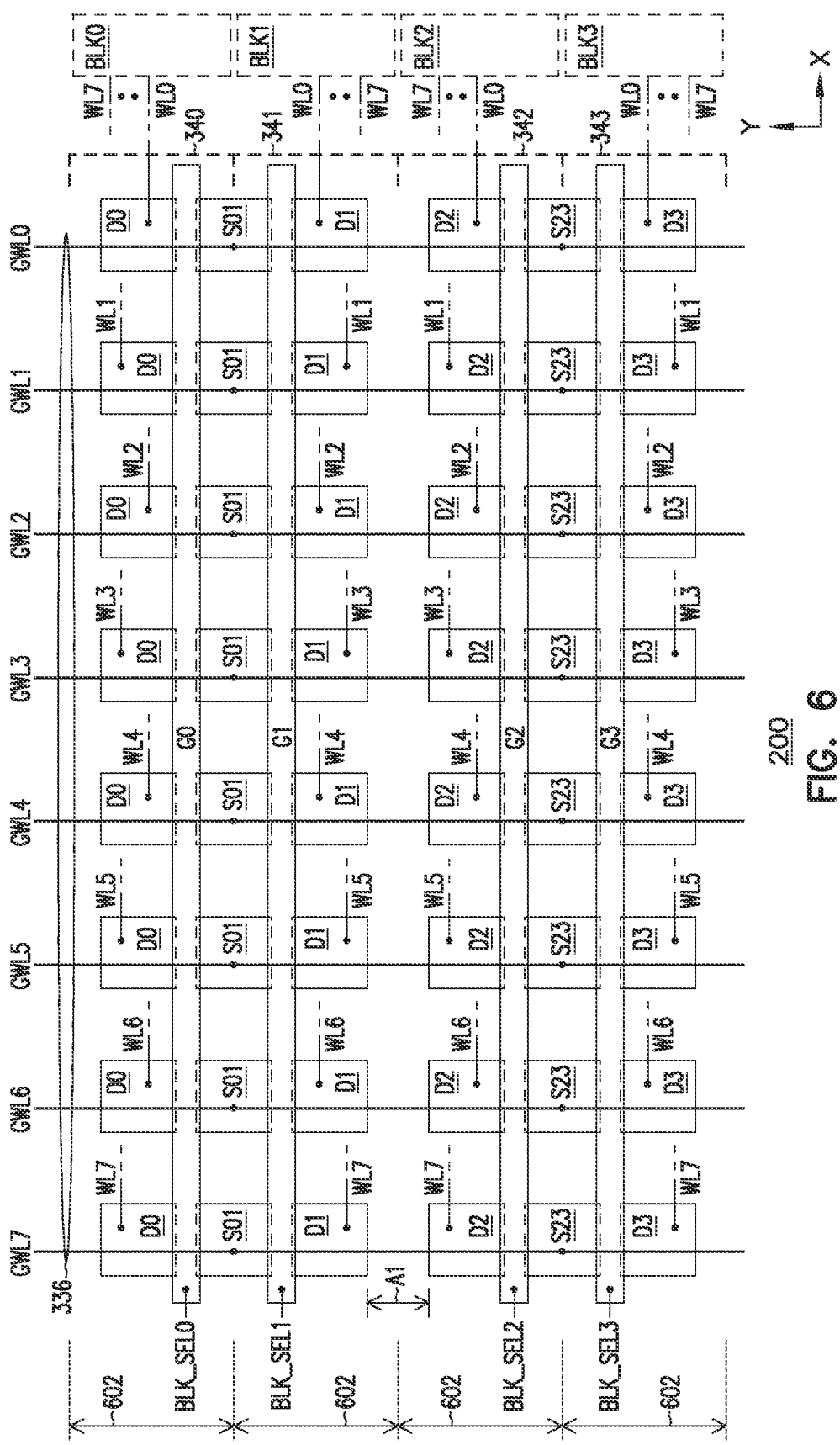
FIG. 6 shows a structure of a portion of the string drivers of FIG. 5, including diffusion regions of the string drivers, according to some embodiments described herein.
Figure 10:
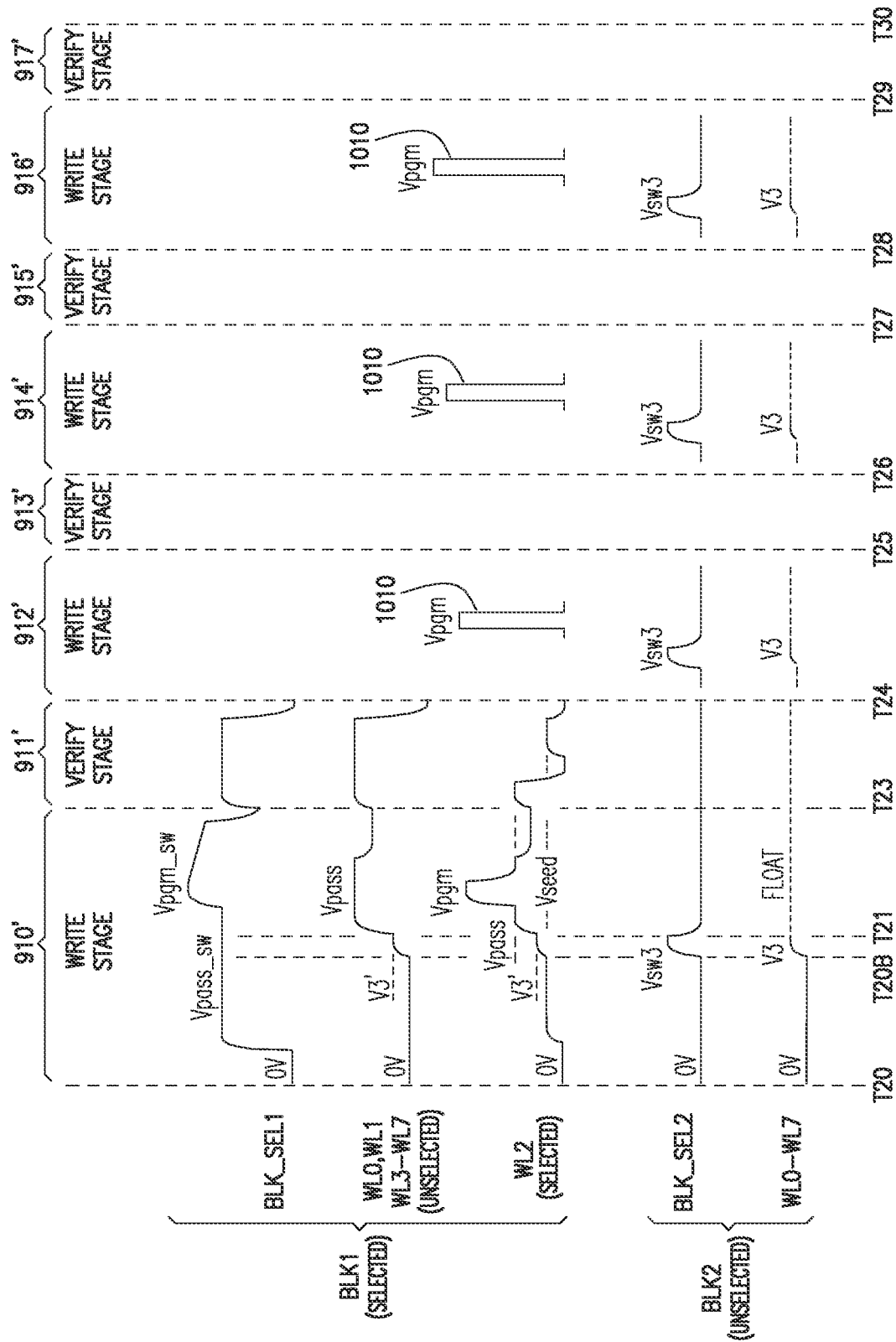

FIG. 10 shows another example write operation of the memory device of FIG. 5 and FIG. 6, according to some embodiments described herein.

Figure 11:
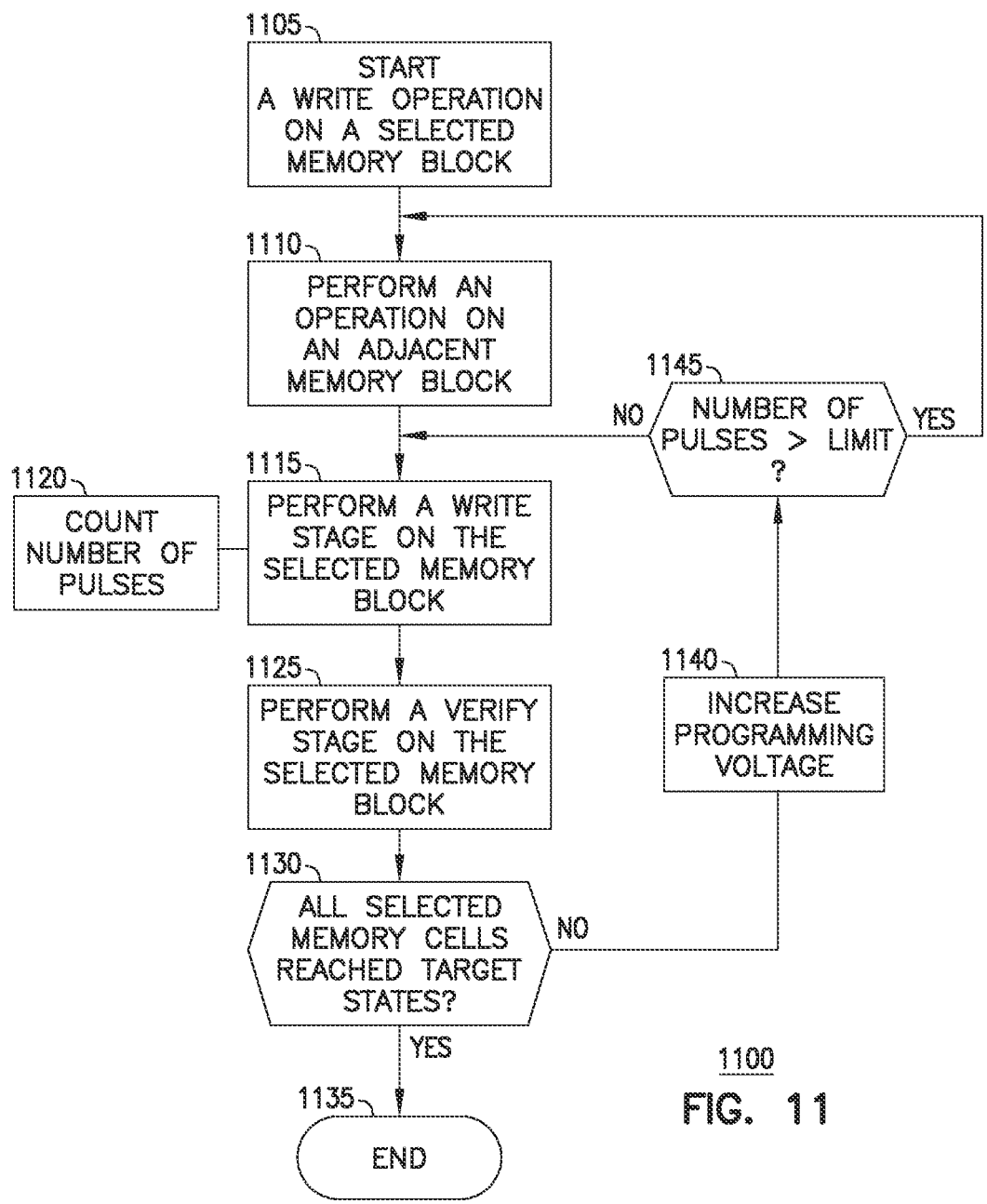

FIG. 11 is a flowchart showing a method for performing a write operation in a memory device, according to some embodiments described herein.

Figure 12:
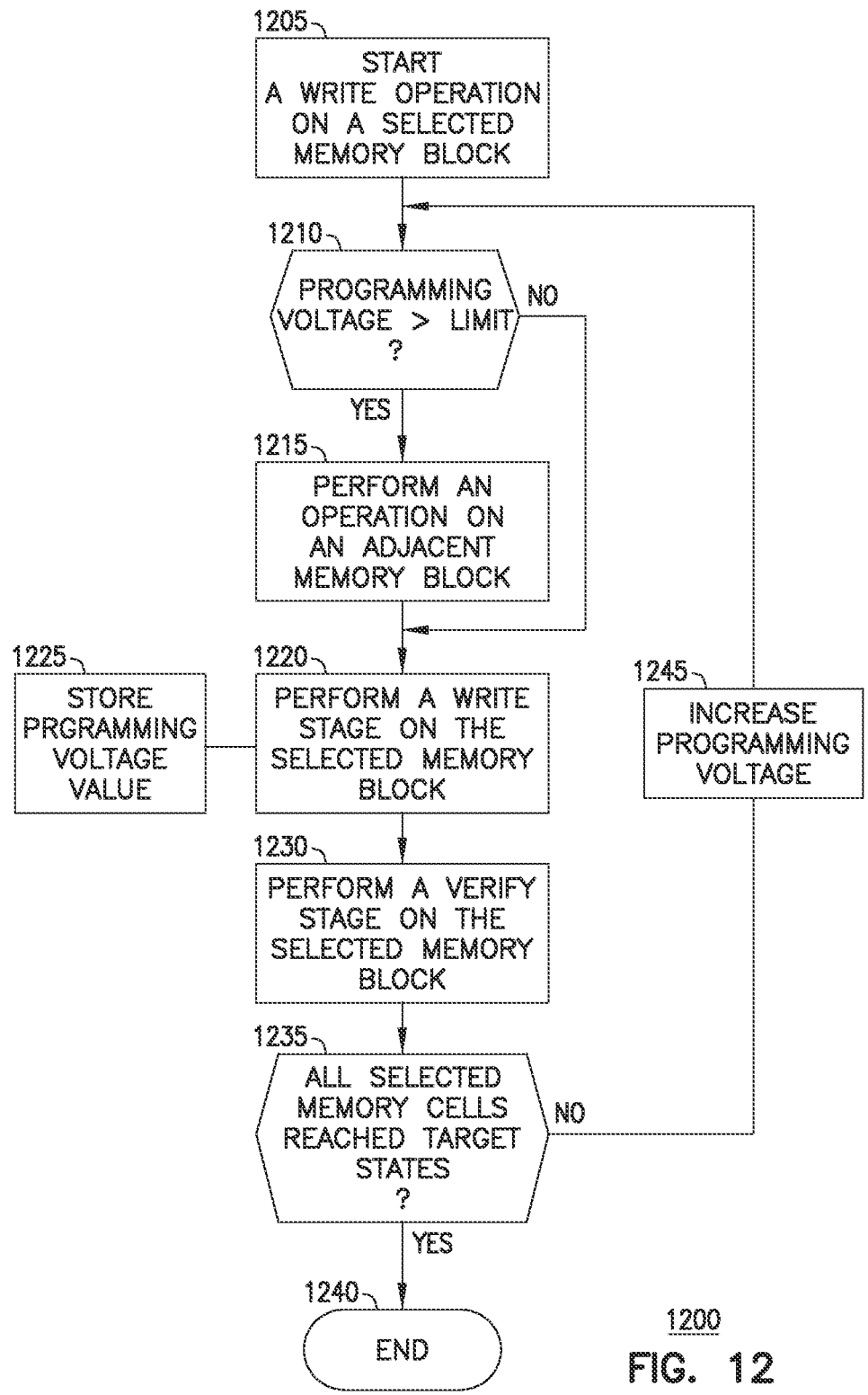

FIG. 12 is a flowchart showing another method for performing a write operation in a memory device, according to some embodiments described herein.

Figure 13:
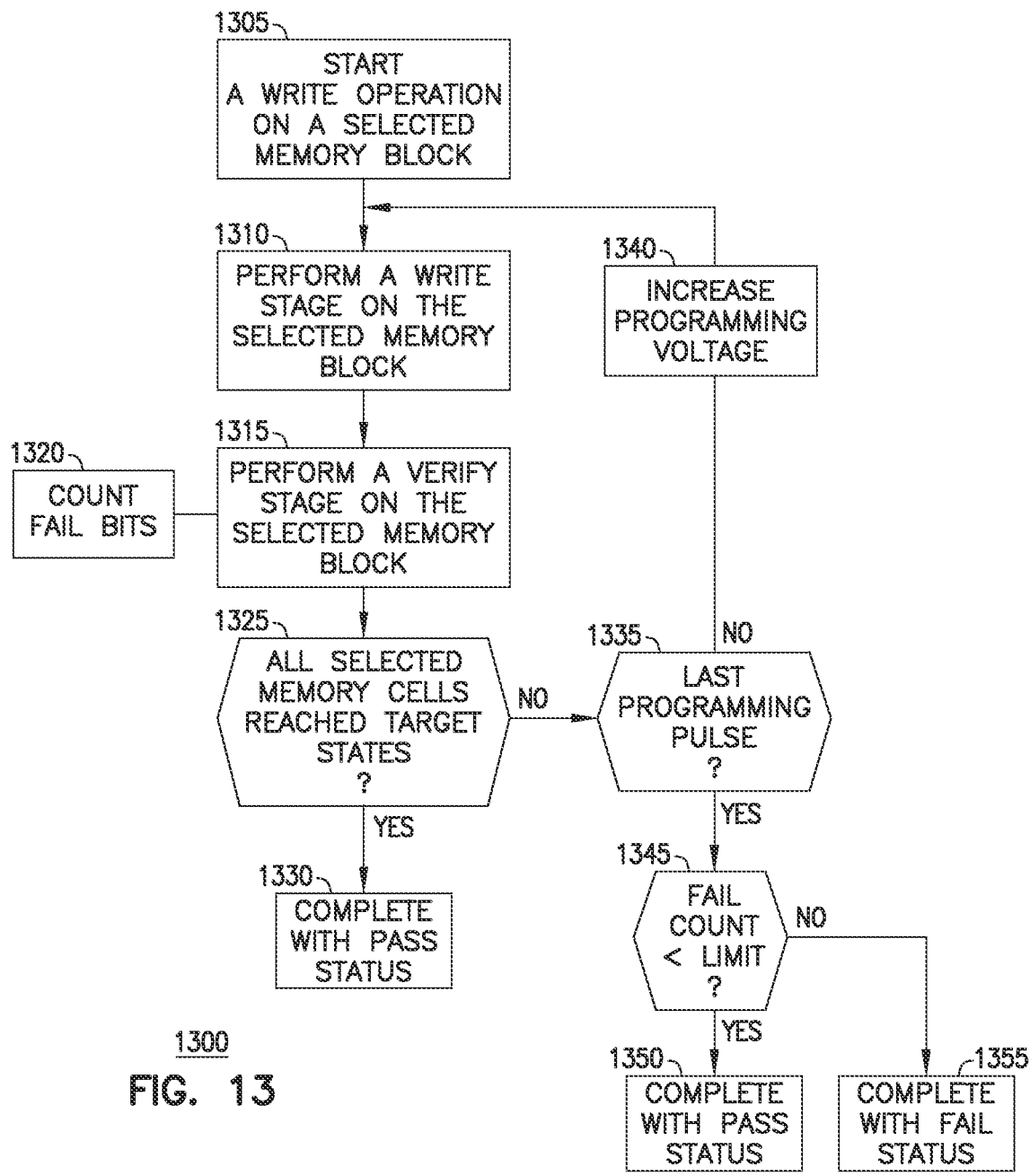

FIG. 13 is a flowchart showing another method for performing a write operation in a memory device, according to some embodiments described herein.

Figure 14:
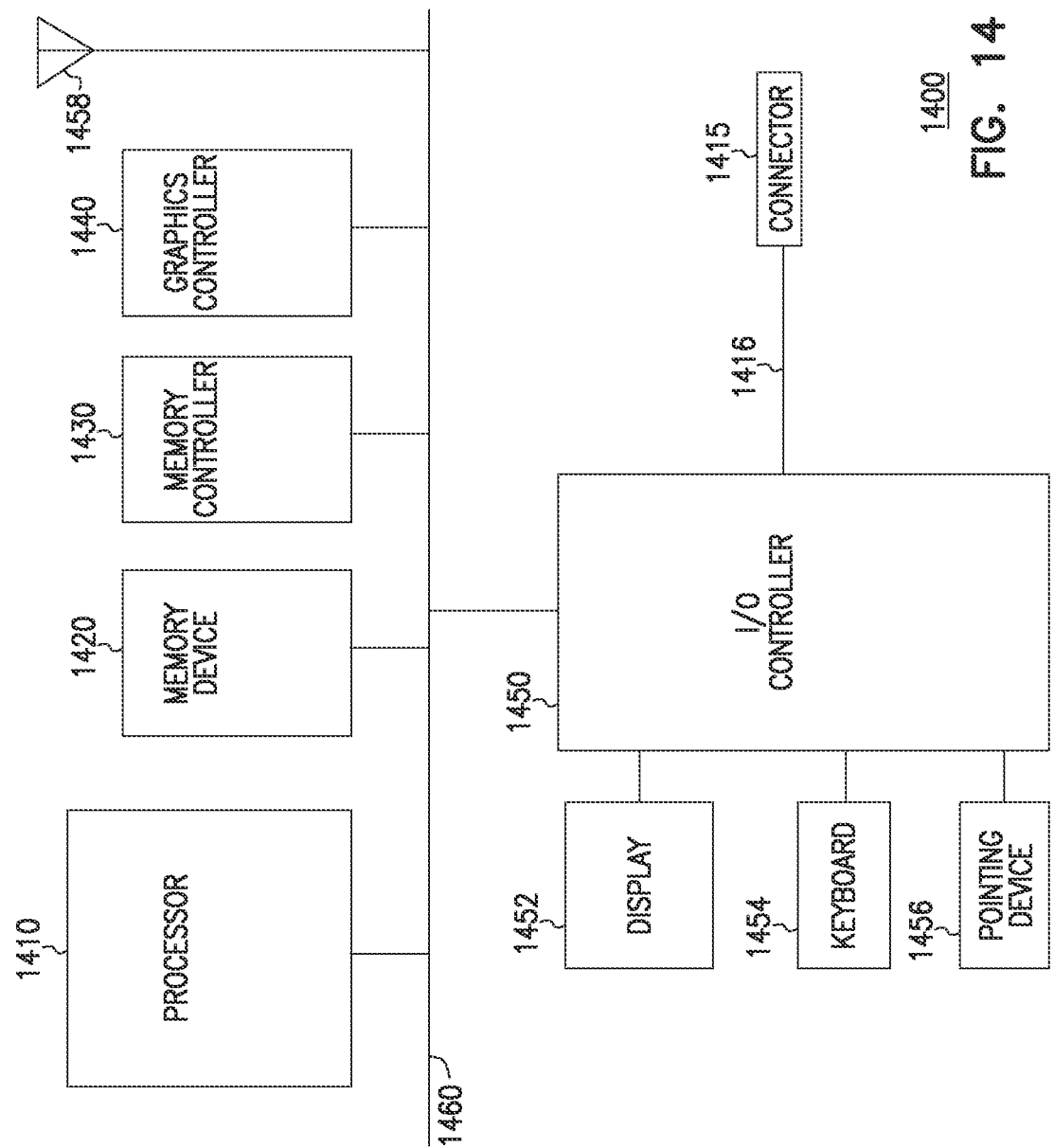

FIG. 14 shows an apparatus in the form of a system including a memory device, according to some embodiments described herein.

DETAILED DESCRIPTION

As the vertical dimension for forming memory cells can be constrained by fabrication processes, increasing memory cell density up to a certain vertical dimension can be difficult. The techniques described herein involve a memory device having circuitry and memory operations that allow the area of some circuitry of the memory device to be reduced. The area reduction of such circuitry can create more room for formation of more memory cells, thereby increasing memory cell density of the memory device in comparison with some conventional memory devices. The circuitry in the described techniques includes string drivers associated with memory blocks of the memory device. During memory operations performed on the memory blocks, different voltages can be applied to specific diffusion regions of the string drivers to counter potential electrical impact of adjacent elements at the reduced area. Detailed circuitry and memory operations and other improvements and benefits of the techniques described herein are further discussed below with reference to FIG. 1 through FIG. 14.

Figure 1:
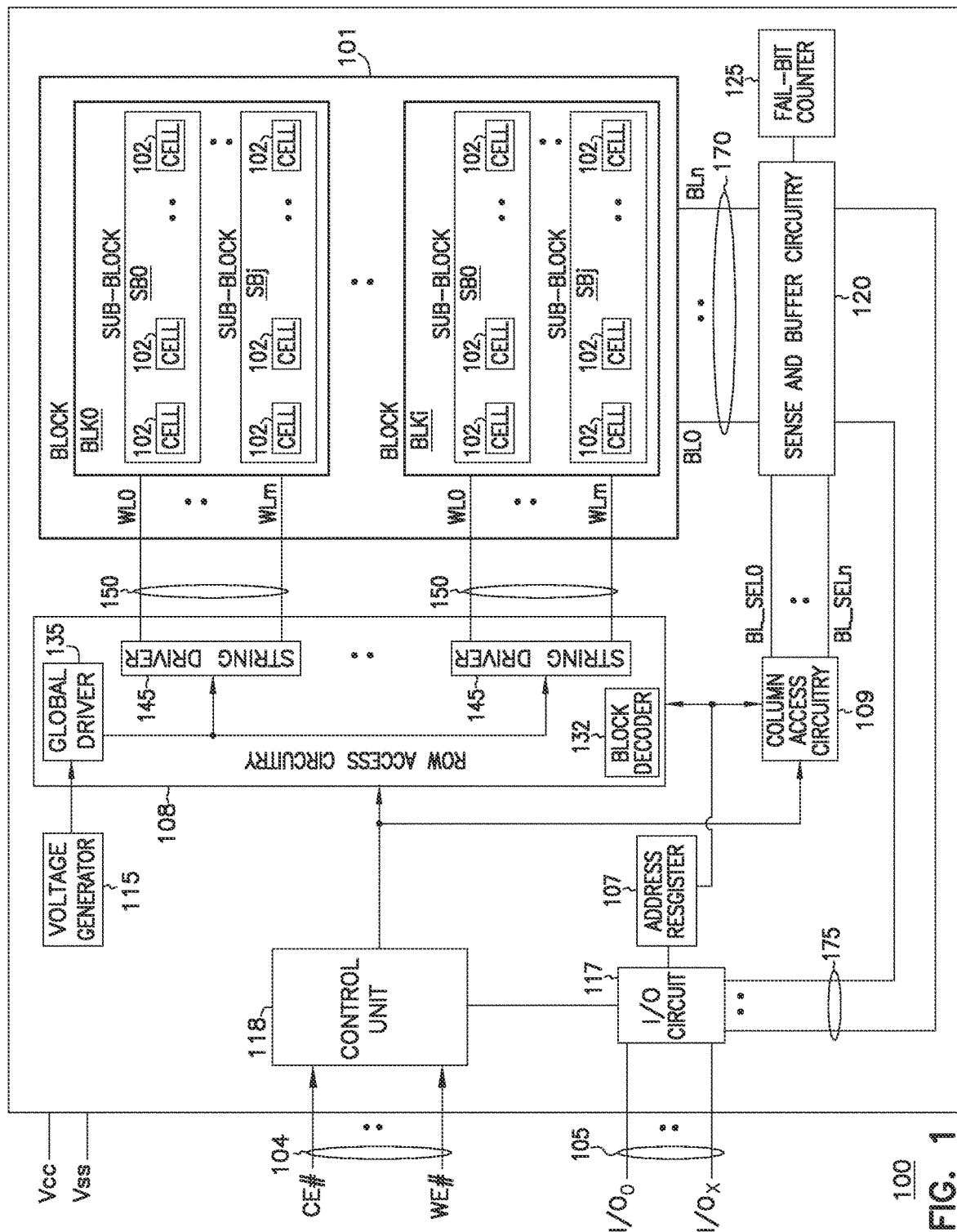
FIG. 1 shows a block diagram of an apparatus in the form of a memory device including a memory array, memory blocks, and string drivers, according to some embodiments described herein.

FIG. 1 shows a block diagram of an apparatus in the form of a memory device 100 including a memory array (or memory arrays) 101, memory blocks BL0 through BLi, and other components of memory device 100, according to some embodiments described herein. Each of memory blocks BLK0 through BLKi can include memory cells 102, which can be included in sub-blocks SB0 through SBj of a respective memory block. A sub-block is a portion of a memory block. In the physical structure of memory device 100, memory cells 102 can be arranged vertically (e.g., stacked one over another) over a substrate (e.g., a semiconductor substrate) of memory device 100.

As shown in FIG. 1, memory device 100 can include access lines (which can include local word lines) 150 in a respective memory block. Memory device 100 can include data lines (which can include bit lines) 170, which can be shared among memory blocks BLK0 through BLKi. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 in respective memory blocks BLK0 through BLKi. Memory device 100 can use data lines 170 to selectively exchange information (e.g., data) with memory cells 102 of memory blocks BLK0 through BLKi.

As shown in FIG. 1, each of memory blocks BLK0 through BLKi can have its own access lines (e.g., word lines) 150 that are electrically separated from access lines (e.g., word lines) 150 of the other memory blocks. Alternatively, two or more of memory blocks BLK0 through BLKi can share access lines.

Sub-blocks of the same memory block can share access lines (e.g., can share word lines) and can be controlled by the same access lines. For example, sub-blocks SB0 through SBj of memory block BLK0 can share access lines 150 of memory block BLK0. Sub-blocks SB0 through SBj of memory block BLKi can share access lines 150 of memory block BLKi.

Memory device 100 can include row access circuitry 108 and column access circuitry 109 that can decode address information from an address register 107. Based on decoded address information, memory device 100 can determine which memory cells 102 of which sub-blocks of which memory blocks BLK0 through BLKi are to be accessed in a memory operation.

Memory device 100 can perform a write (e.g., program) operation to store (e.g., program) information in memory cells 102 of a selected memory block among memory blocks BLK0 through BLKi. Memory device 100 can perform a read operation to read (e.g., sense) information (e.g., previously stored information) from a selected memory block among memory cells 102 of memory blocks BLK0 through BLKi. Memory device 100 can use data lines 170 associated with signals BL0 through BLn to provide information to be stored in or information read (e.g., sensed) from a selected memory block among memory blocks BLK0 through BLKi. Memory device 100 can also perform an erase operation to erase information from one or more of memory blocks BLK0 through BLKi.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry. Memory device 100 can include a voltage generator 115, which can generate different voltages for use during memory operations (e.g., read, write, and erase operations).

As shown in FIG. 1, row access circuitry 108 can include a block decoder 132, a global driver (e.g., global access line driver) 135, and string drivers 145. Block decoder 132 can operate to decode address information (e.g., from address register 107) to determine which of memory blocks BLK0 through BLKi to access in a memory operation (e.g., read, write, or erase operation).

In a memory operation of memory device, global driver 135 can operate to provide voltages to string drivers 145. String drivers 145 can operate to provide voltages to signals WL0 through WLm of respective memory blocks among memory blocks BLK0 through BLKi. Signals WL0 through WLm can be provided with different voltages depending on the operation of memory device 200.

As shown in FIG. 1, memory device 100 can include a control unit 118 that can be configured to control memory operations of memory device 100 based on control signals on lines 104. Example of the control signals include a chip enable signal CE#, a write enable signal WE#, and other signals. The control signals on lines 104 can indicate which operation (e.g., read, write, or erase operation) memory device 100 can perform. Other devices external to memory device 100 (e.g., a memory controller or a processor) may control the values of the control signals on lines 104. Specific values of a combination of the signals on lines 104 may produce a command (e.g., read, write, or erase command) that causes memory device 100 to perform a corresponding memory operation (e.g., read, write, or erase operation).

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., in a read operation) of memory blocks BLK0 through BLKi and provide the value of the information to lines (e.g., global data lines) 175. Sense and buffer circuitry 120 can also be configured to use signals on lines 175 to determine the value of information to be stored (e.g., programmed) in memory cells 102 of memory blocks BLK0 through BLKi in a write operation based on the values (e.g., voltage values) of signals on lines 175 in the write operation. Memory device 100 can include a fail-bit (or fail-byte) counter 125 to count the number of bits that are deemed to be unsuccessfully stored in a memory block in a particular write operation. Memory device 100 can include an error correction code (ECC) mechanism (not shown) to correct bits that are deemed to be in error.

Memory device 100 can include input/output (I/O) circuitry 117 to exchange information (e.g., data, address, and instruction information) with an external device (e.g., (e.g., a memory controller or a processor) through lines (e.g., I/O lines) 105. Signals $I/O_0$ through $I/O_x$ on lines 105 can represent information read from or stored in memory cells 102 of memory blocks BLK0 through BLKi. Lines 104 and lines 105 can include nodes within memory device 100 or pins (or solder balls) on a package where memory device 100 can reside. Other devices external to memory device 100 (e.g., a memory controller or a processor) can communicate with memory device 100 through lines 104 and 105.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits (e.g., more than three bits in each memory cell). A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive Random Access Memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 14.

Figure 2:
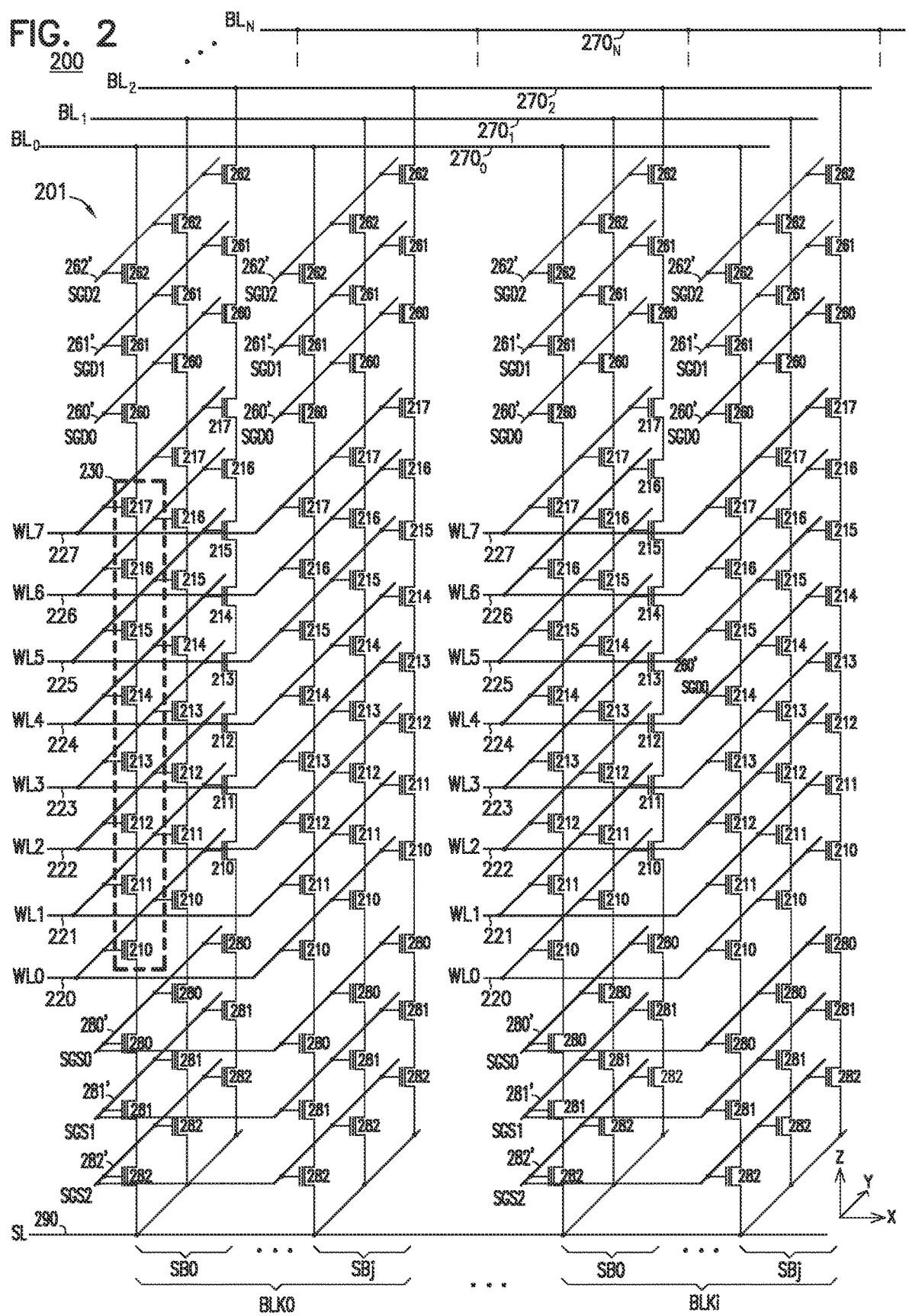
FIG. 2 shows a schematic diagram of a portion of a memory device including a memory array having memory blocks, according to some embodiments described herein.

FIG. 2 shows a schematic diagram of a portion of a memory device 200 including a memory array 201 having memory blocks BLK0 through BLKi and sub-blocks SB0 through SBj in each of the memory blocks, according to some embodiments described herein. Memory device 200 can correspond to memory device 100 of FIG. 1. For example, memory array 201 can form part of memory array 101 of FIG. 1.

In the physical structure of memory device 200, memory blocks BLK0 through BLKi can be arranged (e.g., formed) one memory block next to another memory block, such that each memory block is adjacent another memory block. Adjacent memory blocks are neighboring memory blocks that are located immediately next to each other. Directions X, Y, and Z in FIG. 2 can be relative to the physical directions (e.g., three dimensional (3D) dimensions) of the structure of memory device 200. For example, the Z-direction can be a direction perpendicular to (e.g., vertical direction with respect to) a substrate of memory device 200. The Z-direction is perpendicular to the X-direction and Y-direction (e.g., the Z-direction is perpendicular to an X-Y plane of memory device 200).

Sub-blocks SB0 through SBj in each of memory blocks BLK0 through BLKi are smaller portions of each memory block. Memory blocks BLK0 through BLKi can include the same number of sub-blocks. For example, each of memory blocks BLK0 through BLKi can include four sub-blocks (e.g., sub-blocks SB0, SB1, SB2, and SB3).

Figure 3:
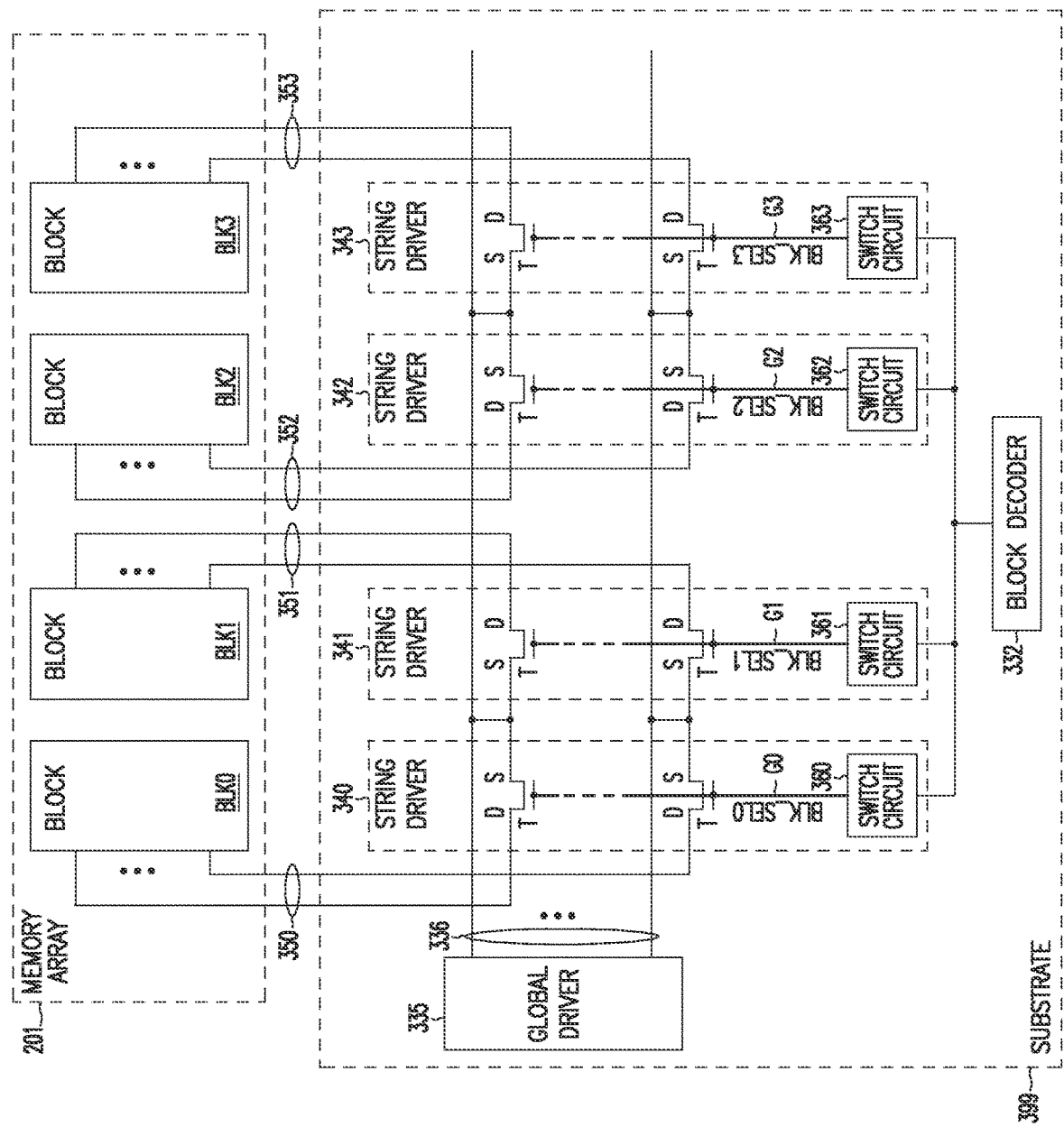
FIG. 3 shows a schematic diagram of the memory device of FIG. 2, including the memory array, the memory blocks, a block decoder, a global driver, and string drivers, according to some embodiments described herein.

As shown in FIG. 3, memory device 200 can include memory cells 210 through 217 arranged in memory cell strings. For simplicity, only memory cell string 230 is labeled. The sub-blocks of the memory blocks (e.g., memory blocks BLK0 through BLKi) of memory device 200 can have the same number of memory cell strings. FIG. 2 shows an example where each memory cell string (e.g., memory cell string 230) includes eight memory cells 210 through 217 as an example. However, each memory cell string can include a different number of memory cells (e.g., up to one hundred or more memory cells in a memory cell string). FIG. 2 shows an example where each sub-block includes three memory cell strings. However, each sub-block can include more than three memory cell strings.

As shown in FIG. 2, memory device 200 can include select gates (e.g., drain select gates or transistors) 260, 261, and 262 that can be controlled by respective select lines (e.g., drain select lines) 260', 261', and 262' and respective signals (e.g., drain select line signals) SGD0, SGD1, and SGD2.

Memory device 200 can include select gates (e.g., source select gates or transistors) 280, 281, and 282 that can be controlled by respective select lines (e.g., source select lines) 280', 281', and 282' and respective signals (e.g., source select line signals) SGS0, SGS1, and SGS2. Each memory cell string can be associated with (e.g., can be coupled to) respective select gates 260, 261, and 262 and respective select gates 280, 281, and 282.

Each sub-block (e.g., SB0 or SBj) has its own memory cell strings, select gates 260, 261, and 262 and associated select lines 260', 261', and 262', and select gates 280, 281, and 282. The sub-blocks within the same memory block can share select lines (e.g., source select lines) 280', 281', and 282'.

FIG. 2 shows each memory cell string associated with three drain select gates (e.g., select gates 260, 261, and 262) and three source select gates (e.g., select gates 280, 281, and 282). However, the number of drain select gates, the number of source select gates, or both associated with a memory cell string can be different from three.

As shown in FIG. 2, memory device 200 can include data lines $270_0$ through $270_N$ that carry signals $BL_0$ through $BL_N$, respectively. Each of data lines $270_0$ through $270_N$ can be structured as a conductive line that can includes conductive materials (e.g., conductively doped polycrystalline silicon (doped polysilicon), metals, or other conductive materials). The memory cell strings of memory blocks BLK0 through BLKi can share data lines $270_0$ through $270_N$ to carry information (in the form of signals) read from or to be stored in memory cells of selected memory cells (e.g., selected memory cells in memory block BLK0 or BLK1) of memory device 200.

Memory device 200 can include a source (e.g., a source line, a source plate, or a source region) 290 that can carry a signal (e.g., a source line signal) SL. Source 290 can be structured as a conductive line or a conductive plate (e.g., conductive region) of memory device 200. Source 290 can be common source common source plate or common source region) of memory blocks BLK0 through BLKi. Alternatively, each of memory blocks BLK0 through BLKi can have its own source similar to source 290. Source 290 can be coupled to a ground connection of memory device 200.

Each of memory blocks BLK0 through BLKi can have its own group of word lines for controlling access to respective memory cells of the memory cell strings of the sub-block of a respective memory block. As shown in FIG. 2, memory device 200 can include word lines (e.g., local word lines) 220 through 227 in each of memory blocks BLK0 through BLKi.

As shown in FIG. 2, word lines 220 through 227 of one memory block (e.g., memory blocks BLK0) can be electrically separated from word lines 220 through 227 of another memory block (e.g., memory blocks BLKi). Thus, memory blocks BLK0 through BLKi can be accessed separately (e.g., accessed one at a time). For example, memory block BLK0 can be accessed at one time using word lines 220 through 227 in memory block BLK0, and memory block BLKi can be accessed at another time using word lines 220 through 227 of memory block BLKi.

Memory device 200 can have the same number of word lines among the memory blocks (e.g., memory blocks BLK0 through BLKi). In the example of FIG. 2, memory device 200 has eight word lines 220 through 227 in each of memory blocks BLK0 through BLKi. However, the number of word lines of the memory blocks (e.g., memory blocks BLK0 through BLKi) of memory device 200 can be different from eight. For example, each of memory blocks BLK0 through BLKi can include up to one hundred (or more) word lines.

Each of word lines 220 through 227 can be part of a structure (e.g., a level) of a conductive material (e.g., a layer of conductive material) located in a level of memory device 200. Word lines 220 through 227 can carry corresponding signals (e.g., word line signals) WL0, WL1, WL2, WL3, WL4 WL5, WL6, and WL7. Memory device 200 can use signals WL0, WL1, WL2, WL3, WL4 WL5, WL6, and WL7 in a respective memory block to selectively control access to respective memory cells of the respective memory block during an operation (e.g., read, write, or erase operation).

For example, during a write operation, memory device 200 can use signals WL0, WL1, WL2, WL3, WL4 WL5, WL6, and WL7 associated with block BLK0 to control access to selected memory cells of memory block BLK0 to store information in selected the memory cells of memory block BLK0. In another example, during read write operation, memory device 200 can use signals WL0, WL1, WL2, WL3, WL4 WL5, WL6, and WL7 associated with block BLK0 to control access to selected memory cells of memory block BLK0 to read (e.g., sense) information (e.g., previously stored information) from the memory cells of memory block BLK0.

FIG. 3 shows a schematic diagram of memory device 200 of FIG. 2, including memory array 201 having memory blocks BLK0, BLK1, BLK2, and BLK3, a block decoder 332, a global driver 335, and string drivers 340, 341, 342, and 343, according to some embodiments described herein. FIG. 3 shows memory device 200 having four memory blocks BLK0, BLK1, BLK2, and BLK3 and four associated string drivers 340, 341, 342, and 343 as an example. However, memory device 200 can include numerous memory blocks and associated string drivers 340, 341, 342, and 343.

Memory blocks BLK0, BLK1, BLK2, and BLK3 are adjacent to each other. As shown in FIG. 3, memory block BLK0 is adjacent memory block BLK1. Memory block BLK1 is adjacent memory blocks BLK2. Memory block BLK2 is adjacent memory block BLK3. In the physical structure of memory device 200, adjacent blocks are located immediately next to each other, such that there is no additional block (or there are no additional blocks) between the adjacent blocks. Adjacent blocks can be called neighboring blocks.

In the physical structure of memory device 200, memory array 201 (which includes memory blocks BLK0, BLK1, BLK2, and BLK3) can be located over (e.g., can be formed over) a substrate (e.g., a semiconductor substrate), such as substrate 399, which is schematically shown in FIG. 3. The structure of substrate 399 is shown in FIG. 5. In the physical structure of memory device 200, block decoder 332, global driver 335, and string drivers 340, 341, 342, and 343 can be located in (e.g., formed in or formed on) substrate 399 and can be located under memory array 201.

As shown in FIG. 3, string drivers 340, 341, 342, and 343 are adjacent each other. String drivers 340 and 341 are adjacent to each other. String drivers 341 and 342 are adjacent to each other. String drivers 342 and 343 are adjacent to each other. String drivers 340, 341, 342, and 343 can be coupled to respective memory blocks BLK0, BLK1, BLK2, and BLK3 through conductive paths (e.g., conductive contacts or conductive lines) 350, 351, 352, and 353.

Each of string drivers 340, 341, 342, and 343 can include transistors T that can share a gate (a common gate or a shared gate) within a respective string driver, such as gate G0, G2, G2, or G3. Gate G0, G2, G2, and G3 can receive signals (e.g., block select signals) BLK_SEL0, BLK_SEL1, BLK_SEL2, and BLK_SEL3, respectively.

Each transistor T can include a drain D and a source S. In this description, drain D and source S are used interchangeably. In the structure of each transistor T, drain D can include a diffusion region (e.g., a doped region), and source S can include another diffusion region (e.g., a doped region) separate from the diffusion region of the drain.

As shown in FIG. 3, the sources of two respective transistors T of string drivers 340 and 341 can be shared (e.g., the sources can be electrically coupled to each other to form a shared source). Similarly, the sources of two respective transistors T of string drivers 342 and 343 can be shared (e.g., the sources can be electrically coupled to each other to form a shared source). In the structure of memory device 200, a shared source can have a single diffusion region.

As shown in FIG. 3, string drivers 340, 341, 342, and 343 can include switch circuits 360, 361, 362, and 363, respectively. Switch circuits 360, 361, 362, and 363 can operate to provide signals BLK_SEL0, BLK_SEL1, BLK_SEL2, and BLK_SEL3, respectively, on respective gates G0, G2, G2, and G3 with different voltages in a memory operation (e.g., read, write, or erase operation) of memory device 200.

Switch circuit 360 can operate to couple gate G0 to different voltages at different times during a memory operation (e.g., read, write, or erase operation) of memory device 200. Thus, signal BLK_SEL1 on gate G0 can be provided with (e.g., can have) different voltages at different times during a memory operation of memory device 200.

Switch circuit 361 can operate to couple gate G1 to different voltages at different times during a memory operation (e.g., read, write, or erase operation) of memory device 200. Thus, signal BLK_SEL1 on gate G1 can be provided with (e.g., can have) different voltages at different times during a memory operation of memory device 200.

Switch circuit 362 can operate to couple gate G2 to different voltages at different times during a memory operation (e.g., read, write, or erase operation) of memory device 200. Thus, signals BLK_SEL0 on gate G2 can be provided with (e.g., can have) different voltages at different times during a memory operation of memory device 200.

Switch circuit 363 can operate to couple gate G3 to different voltages at different times during a memory operation (e.g., read, write, or erase operation) of memory device 200. Thus, signal BLK_SEL3 on gate G3 can be provided with (e.g., can have) different voltages at different times during a memory operation of memory device 200.

Global driver 335 can be coupled to string drivers 340, 341, 342, and 343 through conductive lines (e.g., global access lines) 336. As shown in FIG. 3, conductive lines 336 can be coupled respective sources D of respective transistors T of string drivers 340, 341, 342, and 343. Global driver 335 can operate to provide different voltages on conductive lines 336 in a memory operation (e.g., read, write, or erase operation) of memory device 200.

Switch circuits 360, 361, 362, and 363 can selectively turn on (e.g., activate) transistors T of string drivers 340, 341, 342, and 343, respectively, based on address information from block decoder 332. Memory device 200 can include an address register (like address register 107 of FIG. 1) to provide address information to block decoder 332. Block decoder 332 can operate to determine which string driver among string drivers 340, 341, 342, and 343 can be activated in a memory operation of memory device 200 based on the address information. During a memory operation (e.g., read, write, or erase operation) of memory device 200, the turned-on transistors T of a particular string driver can pass voltages from respective conductive lines 336 to respective memory blocks BLK0, BLK1, BLK2, and BLK3 through respective conductive paths 350, 351, 352, and 353.

Figure 4:
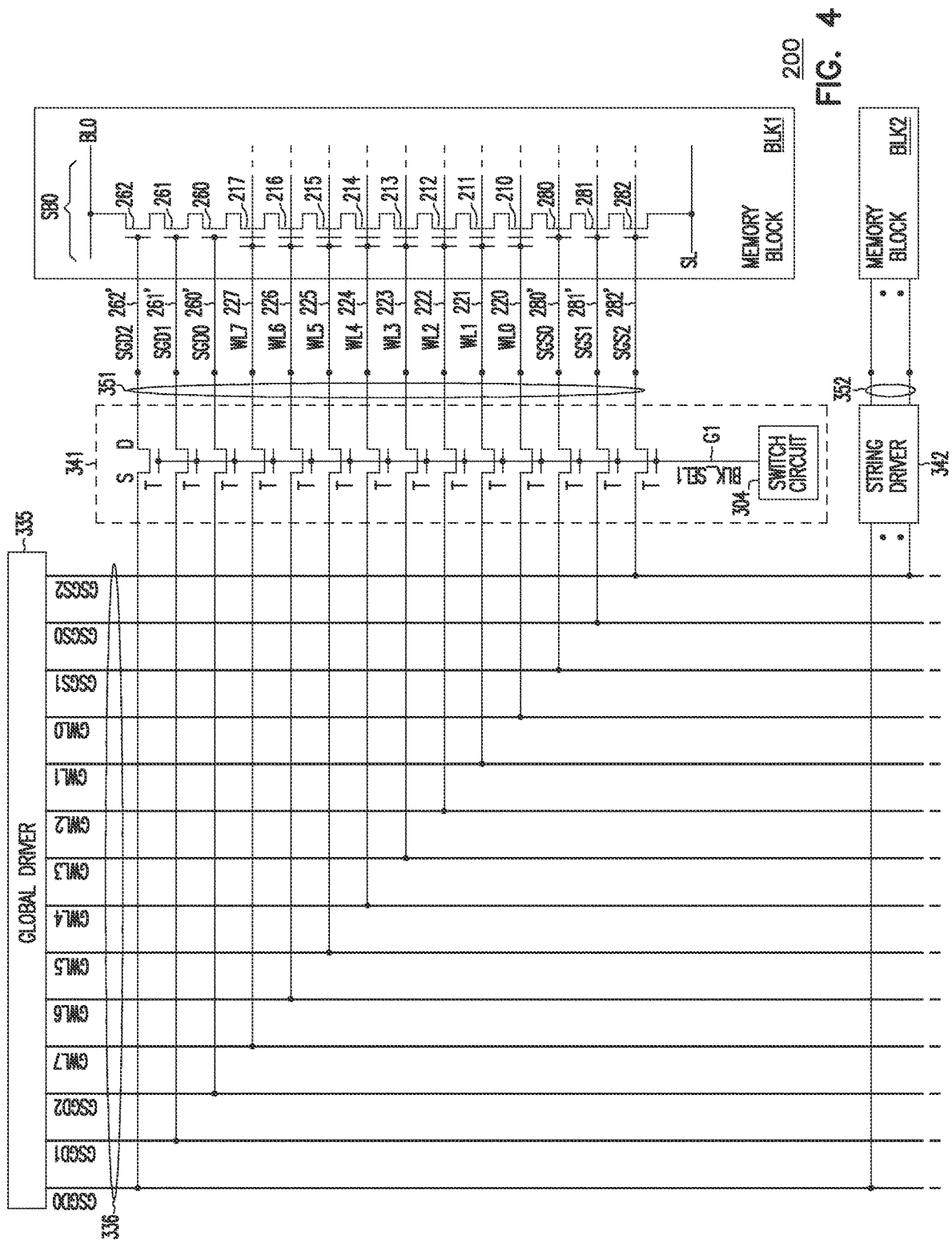
FIG. 4 shows a schematic diagram the memory device of FIG. 3, including connections between of the string drivers, a sub-block of one of the memory blocks, and the global driver of FIG. 3, according to some embodiments described herein.

FIG. 4 shows a schematic diagram of memory device 200 of FIG. 3, including connections between string driver 341, sub-block SB0 of memory block BLK1, and global driver 335 of FIG. 3, according to some embodiments described herein. In FIG. 4, sub-block SB of memory block BLK1 and associated elements (e.g., memory cells 210 through 217 and select gates 260, 261, 262, 280, 281, and 282, signals BL and SL) are the same as those shown in FIG. 2. Thus, their descriptions are not repeated.

As shown in FIG. 4, conductive lines 336 can carry respective signals (e.g., global drain select line signals)

GSGD0, GSGD1, and GSGD2, signals (e.g., global access line signals) GWL0 through GWL7, and signals (e.g., global source line signals) GSGS0, GSGS1, and GSGS2. These signals can be selectively provided to the memory blocks (e.g., memory blocks BLK0, BLK1, BLK2, and BLK3) of memory device 200 by selectively activating (e.g., turning on) string drivers 340, 341, 342, and 343 (FIG. 3).

As show in FIG. 4, the source and drain of each transistor T can be coupled to (e.g., coupled between) a respective conductive line among conductive lines 336 and a respective conductive path among conductive paths 351. For simplicity, source S and drain D of only one transistor T are labeled in FIG. 4.

Other memory blocks and string drivers (e.g., in FIG. 3) of memory device 200 can have connection like memory block BLK1 and string driver 341 of FIG. 4. For example, as shown in FIG. 4, string driver 342 can be coupled to global driver 335 and memory block BLK2 in connections similar to those of string driver 341.

FIG. 5 shows a side view (e.g., cross-section) of a structure of a portion of memory device 200 of FIG. 3, including memory blocks BLK0, BLK1, BLK2, and BLK3 and associated with string drivers 340, 341, 342, and 343, according to some embodiments described herein. As shown in FIG. 5, memory blocks BLK0, BLK1, BLK2, and BLK3 of memory array 201 can be located (e.g., formed) over substrate 399. Substrate 399 can include a semiconductor material. For example, substrate 399 can include monocrystalline silicon (also referred to as single-crystal silicon). The monocrystalline semiconductor material of substrate 399 can include impurities, such that substrate 399 can have a specific conductivity type (e.g., n-type or p-type). Source 290 can be formed on (or formed in) substrate 399. Source 290 can include conductive material (or materials). For example, source 290 can include conductively doped polysilicon, metal, or a combination of both, or other conductive materials.

As shown in FIG. 5, memory device 200 can include different levels 501 through 514 in the Z-direction. Memory cells 210 through 217 of memory blocks BLK0, BLK1, BLK2, and BLK3 can be formed (e.g., formed vertically in Z-direction) in respective levels (e.g., levels 504 through level 511) over substrate 399. Memory cells 210 through 217 of a respective memory cell string (e.g., memory cell string 230) can be located along different portions of a pillar 550 of the respective memory cell string. As shown in FIG. 5, each pillar 550 can extend (e.g., extend vertically) in the Z-direction. Each pillar 550 of a respective memory cell string can be part of a conductive path (e.g., current path) through the respective memory cell string between data line 270$_0$ and source 290. As shown in FIG. 5, data line 270$_0$ can be shared among sub-blocks SB0, SB1, SB2, and SB3 of memory blocks BLK0, BLK1, BLK2, and BLK3.

As shown in FIG. 5, memory blocks BLK0, BLK1, BLK2, and BLK3 are four adjacent memory blocks (e.g., four neighboring memory blocks) that are located immediately next to each other. For example, memory blocks BLK0 and BLK1 are adjacent memory blocks. Memory blocks BLK1 and BLK2 are adjacent memory blocks. Memory blocks BLK2 and BLK3 are adjacent memory blocks. Memory blocks BLK0, BLK1, BLK2, and BLK3 have separate control gates for respective memory cells of respective memory blocks.

As shown in FIG. 5, sub-blocks SB0, SB1, SB2, and SB3 of a respective memory block can share (e.g., can be controlled by) the same control gates (e.g., control gates 220 through 227) of the respective memory block. FIG. 5 shows an example where each of memory blocks BLK0, BLK1, BLK2, and BLK3 include four sub-blocks SB0, SB1, SB2, and SB3. However, the number of sub-blocks can be different from four.

Control gates 220 through 227 (associated with signals WL0 through WL7) in the same block can be located (e.g., can be stacked one over another) on different levels in the Z-direction (e.g., levels 504 through 511) of memory device 200. Control gates 220 through 227 can include conductive material (or materials). Example materials for control gates 220 through 227 include conductively doped polysilicon, metals, or other conductive materials. As shown in FIG. 5, memory device 200 can include dielectric materials (e.g., silicon dioxide) 521 located on different levels in the Z-direction. Dielectric materials 521 in a respective block are interleaved with control gates 220 through 227 in the respective block.

The select lines (e.g., three drain select lines) associated with respective signals SGD0, SGD1, and SGD2 of a sub-block of the same block (e.g., block BLK0) can include respective conductive regions (e.g., three conductive regions) formed in different levels (e.g., levels 512, 513, and 514) in the Z-direction. Each the conductive regions can have a length in the Y-direction (perpendicular to the X-direction). As shown in FIG. 5, each sub-block can have its own drain select lines (associated with respective signals SGD0, SGD1, and SGD2) that are electrically separated from drain select lines (associated with respective signals SGD0, SGD1, and SGD2) of another sub-block. The drain select lines can include conductive materials, which can be the same as (or different from) the materials of control gates 220 through 227. As shown in in FIG. 5, select gates 260, 261, and 262 of a respective sub-block can include respective portions of the drain select lines of the respective sub-block.

The select lines (e.g., three source select lines) associated with respective signals SGS0, SGS1, and SGS2 of a sub-block of the same block (e.g., block BLK0) can include respective conductive regions (e.g., three conductive regions) formed in different levels (e.g., levels 501, 502, and 503) in the Z-direction. Each of the conductive regions can have a length in the Y-direction (perpendicular to the X-direction). As shown in FIG. 5, the sub-blocks of the same memory block can share source select lines (associated with respective signals SGS0, SGS1, and SGS2). The source select lines can include conductive materials, which can be the same as (or different from) the materials of control gates 220 through 227. As shown in in FIG. 5, select gates 280, 281, and 282 of a respective sub-block can include respective portions of the source select lines of the respective sub-block.

As shown in FIG. 5, string drivers 340, 341, 342, and 343 can be located in substrate 399 under respective memory blocks BLK0, BLK1, BLK2, and BLK3. Conductive paths 350, 351, 352, 353 coupled between respective memory blocks and respective string drivers correspond to those same conductive paths shown in FIG. 3. For simplicity, only some of conductive paths 350, 351, 352, 353 are shown in FIG. 5. Each of conductive paths 350, 351, 352, 353 can include a conductive material (e.g., metal (e.g., tungsten)). At least a portion of the conductive material of each conductive path of conductive paths 350, 351, 352, 353 can be formed in the Z-direction (e.g., formed vertically).

In FIG. 5, signal SGD on respective conductive paths 350, 351, 352, 353 can represent separate signals SGD0, SGD1, and SGD2 on respective drain select lines of a respective memory block. Signal SGS on respective conductive paths 350, 351, 352, 353 can represent separate signals SGS0, SGS1, and SGS2 on respective source select lines of a respective memory block.

FIG. 6 shows a structure of a portion of string drivers 340, 341, 342, and 343 of FIG. 5, including diffusion regions, according to some embodiments described herein. As shown in FIG. 6, string drivers 340, 341, 342, and 343 can include respective diffusion regions D0, S01, D1, D2, S23, and D3. These diffusion regions can be formed from separate portions in substrate 399. String drivers 340, 341, 342, and 343 can include respective gates G0, G1, G2, and G3 disposed at locations over respective diffusion regions D0, S01, D1, D2, S23, and D3.

As shown in FIG. 6, each of string drivers 340, 341, 342, and 343 can occupy an area (e.g., area in substrate 399) that has a width 602 in the Y-direction. Width 602 is the same for string drivers 340, 341, 342, and 343. Width 602 can correspond to a width (e.g., a pitch in the Y-direction in X-Y plan) of each memory block in the memory blocks (e.g., memory blocks BLK0, BLK1, BLK2, and BLK3) of memory device 200. As shown in FIG. 6, memory device 200 can have an area (which has a width A1) that is void of diffusion regions of drivers 341 and 342.

As shown in FIG. 6, diffusion regions D0, D1, D2, D3, S01, and S23 are separate portions of materials (e.g., semiconductor materials) in substrate 399 that are doped with impurities (e.g., doped with n-type or p-type dopants). Thus, diffusion regions D0, D1, D2, D3, S01, and S23 can also be called doped regions.

The conductivity type of diffusion regions D0, D1, D2, D3, S01, and S23 is different from the conductivity type of substrate 399. For example, substrate 399 can include a semiconductor material of p-type, and each of diffusion regions D0, D1, D2, D3, S01, and S23 can include a semiconductor material of n-type.

As shown in FIG. 6, diffusion regions S01 are adjacent diffusion regions D0 and D1 and between diffusion regions D1 and D2. Diffusion regions S23 are adjacent diffusion regions D2 and D3 and between diffusion regions D2 and D3. Diffusion regions D1 are adjacent diffusion regions D2.

Each diffusion region S01 and adjacent diffusion region D0 or D1 can form an active area of respective transistor T (e.g., n-channel metal-oxide semiconductor (NMOS) transistor)) in substrate 399. For example, the active area that includes diffusion region S01 and an adjacent diffusion region D0 can form a channel (e.g., transistor channel) to conduct current between diffusion region S01 and the adjacent diffusion region D0 when an appropriate voltage is applied to gate G0. In another example, the active area that includes diffusion region S01 and an adjacent diffusion region D1 can form a channel (e.g., transistor channel) to conduct current between diffusion region S01 and the adjacent diffusion region D1 when an appropriate voltage is applied to gate G1.

Similarly, each diffusion region S23 and an adjacent diffusion region D2 or D3 can form an active area (e.g., active area of a respective transistor T) in substrate 399. For example, the active area that includes diffusion region S23 and an adjacent diffusion region D2 can form a channel (e.g., transistor channel) to conduct current between diffusion region S23 and the adjacent diffusion region D2 when an appropriate voltage is applied to gate G2. In another example, the active area that includes diffusion region S23 and an adjacent diffusion region D3 can form a channel (e.g., transistor channel) to conduct current between diffusion region S23 and the adjacent diffusion region D3 when an appropriate voltage is applied to gate G3.

Diffusion regions D0, S01, D1, D2, S23, and D3 can be part of respective drain and source of transistors T of string drivers 340, 341, 342, and 343. For example, diffusion regions D0 can be part of respective drains of respective transistors T (FIG. 3) of string driver 340. Diffusion regions D1 can be part of respective drains of respective transistors T (FIG. 3) of string driver 341. Diffusion regions D2 can be part of respective drains of respective transistors T (FIG. 3) of string driver 342. Diffusion regions D3 can be part of respective drains of respective transistors T (FIG. 3) of string driver 343. Diffusion regions S01 can be part of respective shared sources S of respective transistors T (FIG. 3) of string drivers 340 and 341. Diffusion regions S23 can be part of respective shared sources S of respective transistors T (FIG. 3) of string drivers 342 and 343.

Thus, a transistor T (not labeled in FIG. 6) of string driver 340 can include a diffusion region D0 and an adjacent diffusion region S01. A transistor T of string driver 341 can include a diffusion region D1 and an adjacent diffusion region S01. A transistor T of string driver 342 can include a diffusion region D2 and an adjacent diffusion region S23. A transistor T of string driver 343 can include a diffusion region D3 and an adjacent diffusion region S23.

Each of gates G0, G1, G2, and G3 can include a conductive material (e.g., metal) and can length extend in the X-direction. As shown in FIG. 6, gate G0 can be located over a location (e.g., locations of transistor channels of respective transistors T) between diffusion regions D0 and S01. Gate G0 can be separated (in the Z-direction) from diffusion regions D0 and S01 by a dielectric material (e.g., a gate oxide (e.g., silicon dioxide)).

Gate G1 can be located over a location (e.g., locations of transistor channels of respective transistors T) between diffusion regions S01 and D1. Gate G1 can be separated (in the Z-direction) from diffusion regions S01 and D1 by a dielectric material (e.g., a gate oxide (e.g., silicon dioxide)).

Gate G2 can be located over a location (e.g., locations of transistor channels of respective transistors T) between diffusion regions D2 and S23. Gate G2 can be separated (in the Z-direction) from diffusion regions D2 and S23 by a dielectric material (e.g., a gate oxide (e.g., silicon dioxide)).

Gate G3 can be located over a location (e.g., locations of transistor channels of respective transistors T) between diffusion regions S23 and D3. Gate G3 can be separated (in the Z-direction) from diffusion regions S23 and D3 by a dielectric material (e.g., a gate oxide (e.g., silicon dioxide)).

As shown in FIG. 6, each of conductive lines 336 (associated with signals GWL0 through GWL7) can be coupled to (e.g., can contact) a respective diffusion region S01 and a respective diffusion region S23. In FIG. 6 the word lines of a respected memory block BLK0, BLK1, BLK2, or BLK3 are associated with signals WL0 through WL7 of the respective memory block. Thus, as shown in FIG. 6, diffusion regions D0 can be coupled to (e.g., can contact (in electrical contact with)) respective word lines (associated with signals WL0 through WL7) of memory block BLK0. Diffusion regions D1 can be coupled to (e.g., can contact (in electrical contact with)) respective word lines (associated with signals WL0 through WL7) of memory block BLK1. Diffusion regions D2 can be coupled to (e.g., can contact (in electrical contact with)) respective word lines (associated with signals WL0 through WL7) of memory block BLK2. Diffusion regions D3 can be coupled to (e.g., can contact (in electrical contact with)) respective word lines (associated with signals WL0 through WL7) of memory block BLK3.

For simplicity, FIG. 6 omits other diffusion regions of string drivers 340, 341, 342, and 343 that are coupled to other components, such as respective drain select lines (e.g., select lines associated with signals SGD0, SGD1, and SGD2 in FIG. 4) and source select lines (e.g., select lines associated with signals SGS0, SGS1, and SGS2 in FIG. 4), and other conductive lines of global driver 335.

In FIG. 6, a voltage can be selectively applied to diffusion regions D0, D1, D2, and D3 during a memory operation (e.g., read, write, or erase operation) by selectively turning on transistors T of a respective string driver. For example, diffusion regions D1 can be applied with a voltage by applying a voltage to diffusion regions S01 and applying a voltage to gate G1. In another example, diffusion regions D2 can be applied with a voltage by applying a voltage to diffusion regions S23 and applying a voltage to gate G2.

The connection (e.g., electrical contact) between a diffusion region and a respective control gate (associated with one of signals WL0 through WL7) of a particular memory block allows a voltage applied to the diffusion to be passed (to also be applied) to the respective control gate of that, particular memory block.

Figure 7:
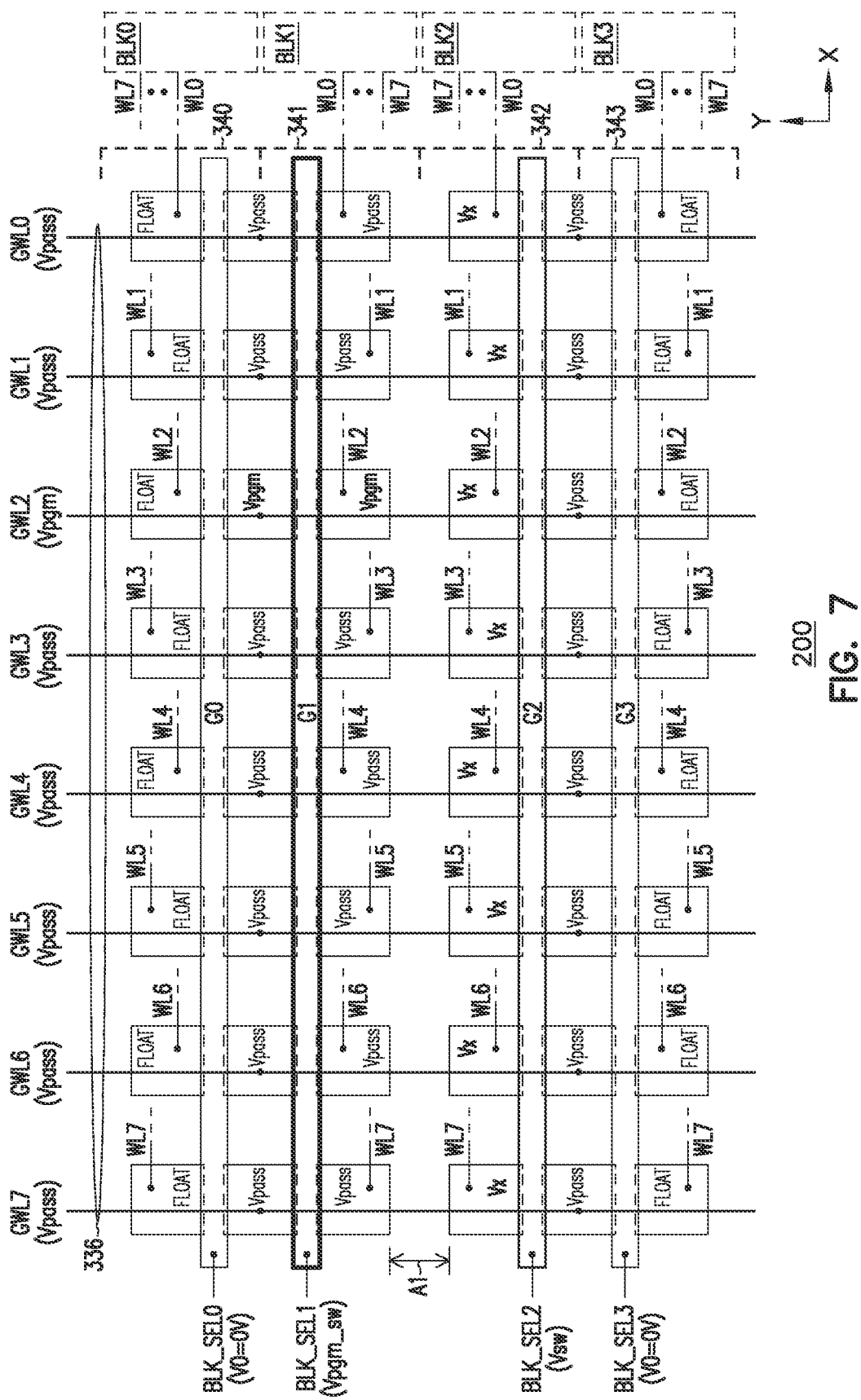
FIG. 7 shows example voltages selectively applied to some of the diffusion regions of the string drivers of FIG. 6 in part of a write operation of the memory device, according to some embodiments described herein.

FIG. 7 shows the structure of the portion of string drivers 340, 341, 342, and 343 of FIG. 6, including example voltages selectively applied to diffusion regions D1, D2, S01, and S23 (labeled in FIG. 6) in part of a write operation performed on memory block BLK1, according to some embodiments described herein. The write operation in FIG. 7 assumes that memory block BLK1 is a memory block selected by memory device 200 to store information in selected memory cells 212 (FIG. 2 and FIG. 4) of selected sub-block SB0 (FIG. 2 and FIG. 4). Memory cells 210, 211, and 213 through 217 are unselected (not selected) to store information in this example. Thus, in this example, control gate 222 (associated with signal WL2, FIG. 2, FIG. 4, FIG. 5, and FIG. 6) is a selected control gate, which is a control gate associated a selected memory cell (e.g., memory cells 212 in this example) of the selected memory block (e.g., memory block BLK1 in this example). Other word lines 220, 222, and 223 through 227 (associated with respective signals WL0, WL1, and WL3 through WL, FIG. 2, FIG. 4, FIG. 5, and FIG. 6) are unselected (e.g., deselected) word lines, which are the word lines associated with unselected memory cells (e.g., memory cells 210, 211, and 213 through 217 in this example).

The following description describes part of a write operation (not a complete write operation) to show an example of some of the voltages applied to respective diffusion regions D1, D2, S01, and S23 of respective string drivers 340, 341, 342, and 343. Other write operations are described in detail with reference to FIG. 8 through FIG. 13.

As shown in FIG. 7, a voltage Vpgm (e.g., a programming voltage or write voltage) can be applied to diffusion region S01 (labeled in FIG. 6). Voltage Vpgm can have a relatively high value (e.g., 14V to 24V) to allow information to be stored in the selected memory cell of memory block BLK1 (selected memory block). A voltage Vpgm_sw can be applied to gate G1 to turn on (e.g., activate) transistors T of string driver 341. Voltage Vpgm_sw can have a value (e.g., 28V) greater than the value of voltage Vpgm. This is to allow voltage Vpgm from diffusion region S01 to be passed to diffusion region D1 (labeled in FIG. 6) associated with the selected control gate (associated with signal WL2) of the selected memory block (memory block BLK1 in this example). A voltage Vpass can be applied to other diffusion regions of string driver 341 that are associated with unselected (e.g., deselected) word lines (e.g., the word lines associated with signals WL0, WL1, WL3 through W7) of memory block BLK1. Voltage Vpass can have a value (e.g., 10V) less than the value of voltage Vpgm. This is to prevent storing information in the unselected memory cells of memory block BLK1 and allow the unselected memory cells in the same memory cell string as the selected memory cell of memory block BLK1 to operate as pass gate (e.g., a turned-on transistor).

As shown in FIG. 7, a voltage Vx can also be applied to diffusion regions D2 (labeled in FIG. 6), which are the diffusion regions associated with unselected memory block BLK2. Voltage Vx can have a value relatively less than the value of voltage Vpass and voltage Vpgm. In an example, voltage Vx can have a value from 2V to 4V. The values of voltages described in this description (e.g., description of FIG. 7 and other figures) are example values. Other voltage values may be used.

Applying voltage Vx to diffusion regions associated with an unselected memory block (e.g., memory block BLK2 in this example) can allow memory device 200 to have improvements and benefits in comparison with some conventional memory devices, as discussed below.

As shown in FIG. 6 and FIG. 7, diffusion regions D2 are adjacent diffusion regions D1. In a write operation, a voltage difference between diffusion regions D1 and diffusion regions D2 can be relatively high if voltage Vx is not applied to diffusion regions D2 (e.g., if diffusion regions D2 remain at 0V). Such a high voltage difference (between diffusion regions D1 and D2) can be close to the value of voltage Vpgm. This high voltage difference may cause interference between adjacent word lines (associated with signals WL) coupled to respective diffusion regions D1 and D2. This can degrade performance of memory device 200. Applying voltage Vx as shown in FIG. 7 can reduce the relative voltage difference. This can reduce the interference, thereby improving operations of memory device 200.

Moreover, applying voltage Vx as shown in FIG. 7 can also provide other improvements and benefits. For example, since voltage Vx can be applied to diffusion regions D2 to reduce a relatively high voltage difference, diffusion regions D1 and D2 can be placed (e.g., formed) closer to each other. For example, in FIG. 6, diffusion regions D1 and D2 can be placed closer to each other, such that the area having width A1 can be reduced (e.g., shrink). This area reduction can create extra room (e.g., more space in the X-Y direction) in memory device 200 for other components memory device 200. For example, the created extra room can be used to form more memory cells (in the X-Y direction). This can increase memory cell density of memory device 200.

Figure 8:
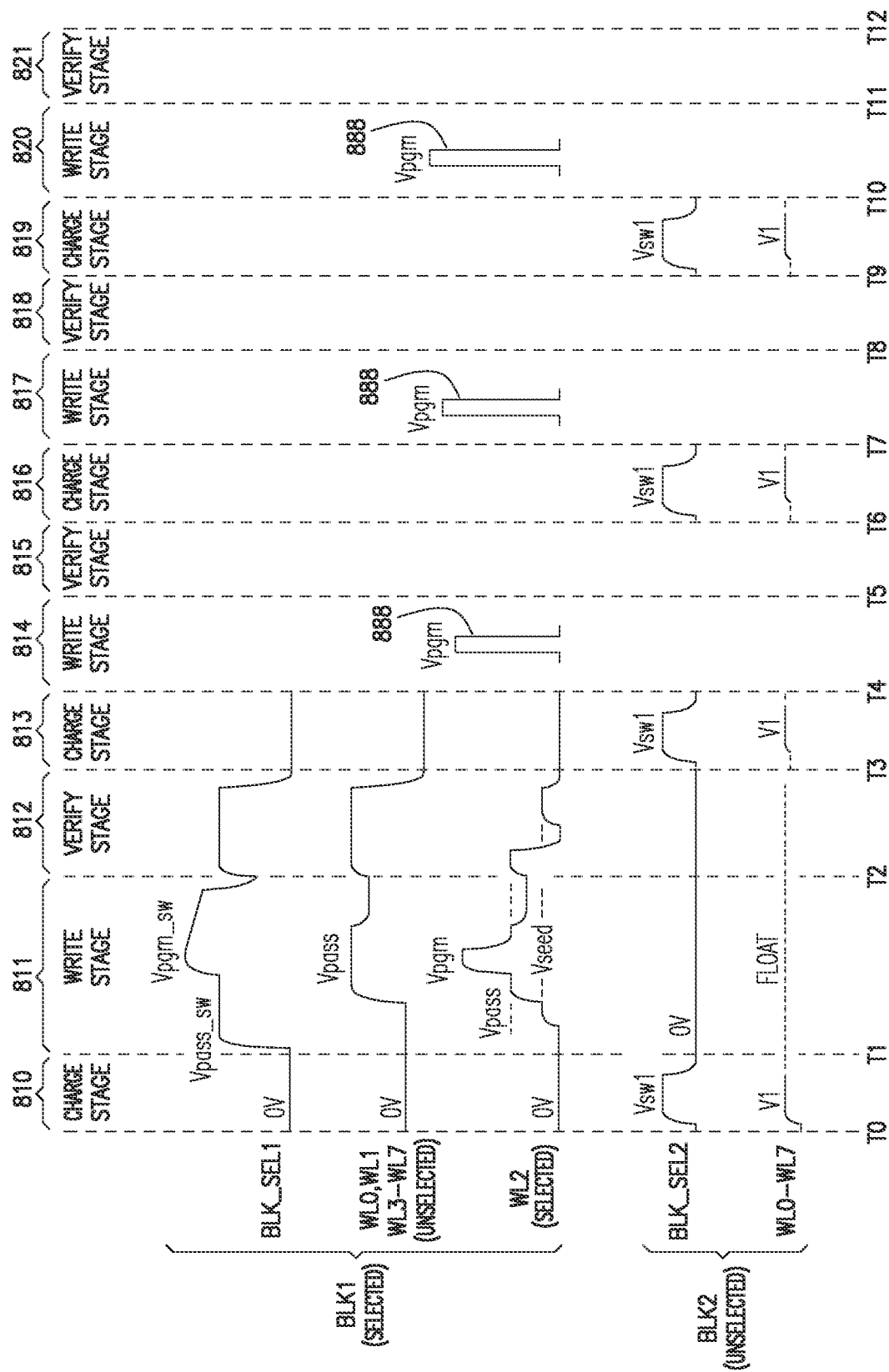
FIG. 8 shows an example write operation of the memory device of FIG. 5 and FIG. 6, including waveforms of signals associated with a selected memory block and an unselected memory block, according to some embodiments described herein.

FIG. 8 shows an example write operation of memory device 200 of FIG. 5 and FIG. 6, including waveforms of signals associated with a selected memory block (e.g., memory block BLK1) and an unselected memory block (e.g., memory block BLK2), according to some embodiments described herein. As shown in FIG. 8, the write operation of storing information in selected memory cell of memory block BLK1 can include different stages (e.g., different operations) between times T0 and T12. The stages include charge (e.g., precharge) stages 810, 813, 816, and 819, write stages 811, 814, 817, and 820, and verify (write verify) stages 812, 815, 818, and 821. The charge, write, and verify stages shown in FIG. 8 can be performed sequentially as shown in FIG. 8.

FIG. 8 shows an example of four charge stages, four write stages, and four verify stages performed in a write operation by memory device 200. However, memory device 200 can perform different numbers of charge, write, and verify stages. Further, as described below, some of the charge stages can be skipped (e.g., not performed).

In FIG. 8, times T0 through T12 indicate different times (points in time) during the write operation associated with FIG. 8. Time T0 occurs before time T1, time T1 occurs before time T2, and so on. Memory device 200 can start a write operation at time T0 and end the write operation at time T12.

In the example write operation associated with FIG. 8, memory block BLK1 is assumed to be a selected memory block to store information in selected memory cell of memory block BLK1. Memory block BLK2 and other memory blocks (e.g., memory blocks BLK1 and BLK3) are unselected memory blocks.

Signals BLK_SEL1, WL0, WL1, WL3 through WL7, and WL2 associated with memory block BLK1, and signal BLK_SEL2 and WL0 through WL7 associated with memory block BLK2 in FIG. 8 are the same signals shown in FIG. 5 and FIG. 6.

In FIG. 8, voltages (e.g., voltage levels) Vpgm_sw, Vpass_sw, Vpass, Vseed, Vpgm, Vsw1, and V1 associated with the signals in FIG. 8 are also the voltages applied to respective diffusion regions (e.g., diffusion regions S01, S23, D1 and D2) and gates G1 and G2 of FIG. 6. The voltages in FIG. 8 are also voltages on respective control gates associated with signals WL0 through WL7 of memory blocks BLK1 and BLK2 (FIG. 5). In the write operation associated with FIG. 8, global driver 335 (FIG. 3 and FIG. 4) can operate to apply different voltages on conductive lines 336. The voltages associated with signals associated with signals WL0 through WL7 of memory blocks BLK1 and BLK2 in FIG. 8 are based on the voltages on conductive lines 336 (FIG. 3 and FIG. 4) passed to respective diffusion regions D1 and D2 by string drivers 341 and 342 (FIG. 3, FIG. 4, and FIG. 5).

As shown in FIG. 8, memory device 200 can start the write operation with charge stage 810 (e.g., between times T0 and T1). In charge stage 810, signal BLK_SEL2 can be provided with a voltage Vsw1 to turn on transistors T of string driver 342 (FIG. 6) to apply voltage V1 to diffusion regions D2 associated with signals WL0 through WL7 of memory block BLK2. Voltage Vsw1 can have a value of 5V (or approximately 5V). Voltage V1 can have a value in a range from 2V to 4V. As mentioned above, the values of voltages described in this description are example values. Other voltage values may be used.

In FIG. 8, memory device 200 can performed write stage 811 (e.g., between times T1 and T2) after charge stage 810 is performed. Write stage 811 can be performed to store information in selected memory cells of memory block BLK1 (selected memory block). For example, write stage 811 can be performed to cause the states (e.g., threshold voltages) of the selected memory cells to move toward respective target states (e.g., target threshold voltages). In write stage 811, signal BLK_SEL1 can be provided with voltages Vpass_sw and Vpgm_sw to turn on transistors T of string driver 341 (FIG. 6). Signals WL0 through WL7 associated with memory block BLK1 can be provided with respective voltages Vseed, Vpass, and Vpgm, which are the voltages applied to diffusion regions D1 in write stage 811. Voltage Vseed can be less than a supply voltage (e.g., Vcc) of memory device 200. For example, Vseed can have a value of 2V (or approximately 2V). Voltage Vpass can have a value of 10V (or approximately 10V). Voltage Vpass_sw can have a value of 28V (or approximately 28V).

Thus, as described above and as shown in FIG. 8, signals WL0 through WL7 associated with unselected memory block BLK2 can be provided with voltage V1 while the signals associated with selected memory block BLK1 remain at 0V (e.g., can be coupled to ground). This indicates that voltage V1 can be applied to diffusion regions D2 (associated with unselected memory block BLK2) before a voltage (e.g., Vseed, Vpass, or Vpass_sw) is applied to diffusion regions D1 associated with selected memory block BLK1.

Memory device 200 can perform verify stage 812 to determine whether the selected memory cells reach respective target states. The write operation in the example of FIG. 8 can end after verify stage 812 if memory device 200 determines that the selected memory cells reach respective target states based on results from verify stage 812.

Memory device 200 can repeat the charge stage, the write stage, and the verify stage (e.g., after time T3) if memory device 200 determines that fewer than all selected memory cells reach respective target states. In FIG. 8, repeated stages can include charge stages 813, 816, and 819, write stages 814, 817, and 820, and verify stages 815, 818, and 821. As shown in FIG. 8, memory device 200 can apply same voltages Vsw1 and V1 to respective signals BLK_SEL2 and WL0 through WL7. However, voltage Vpgm on signal WL2 associated with selected memory block BLK1 can be increased (e.g., sequentially increased) each time the write stage is repeated. For example, FIG. 8 shows voltage Vpgm has a step-up pattern in the repeated write stages between times T3 and T12. Voltage Vpgm can be provide by a pulse (e.g., programming pulse) 888. As shown in FIG. 8, pulse 888 can have different voltage values (e.g., different amplitudes) each time the write stage is repeated. The example write operation associated with FIG. 8 can end after time T12 at which the selected memory cells are deemed to reach respective target states.

Some of charge stages in the write operation of memory device 200 can be skipped (e.g., not performed) based on some conditions (e.g., predetermined criteria) configured in (e.g., set in) memory device 200. For example, memory device 200 can keep track (e.g., store) the number of pulses (e.g., pulse 888) that are used in the write stages. In this example, a charge stage (e.g., one of charge stages 813, 816, and 819) can be skipped (e.g., not performed) if the number of pulse 888 is not greater than a limit (e.g., a predetermined pulse number). In this example, a charge stage is not skipped (e.g., is performed) if the number of pulse 888 is greater than a limit. The limit value can be selected based on the characteristics of memory device 200 and can be a programmable (e.g., trimmable) value. The limit value can be stored in memory device 200. For example, a control unit of memory device 200 (like control unit 118 of FIG. 1) can include a register to store the limit value. Memory device 200 can continue with a next write stage after a preceding verify stage if a charge stage is skipped.

In an alternative write operation, the conditions to skip a charge stage can be based on the value of voltage Vpgm and a value of a limit. For example, a control unit of memory device 200 (like control unit 118 of FIG. 1) can include a register to store a voltage value (e.g., predetermined value) for a limit. The stored value of the limit can be selected based on the characteristics of memory device 200 and can be a programmable (e.g., trimmable) value. In this example, a charge stage (e.g., one of charge stages 813, 816, and 819) can be skipped if the value of voltage Vpgm to be used in a particular write stage is not greater than a limit (e.g., a predetermined value of voltage Vpgm). In this example, a charge stage is not skipped (e.g., is performed) if the value of voltage Vpgm is greater than the limit. Memory device 200 can continue with a next write stage after a preceding verify stage if a charge stage is skipped.

Operating a write operation as described above with reference to FIG. 8 (e.g., applying voltage V1 to a diffusion regions D2 associated with memory block BLK2 (unselected memory block)) can allow memory device 200 to have improvements and benefits discussed above with reference to FIG. 7.

Figure 9:
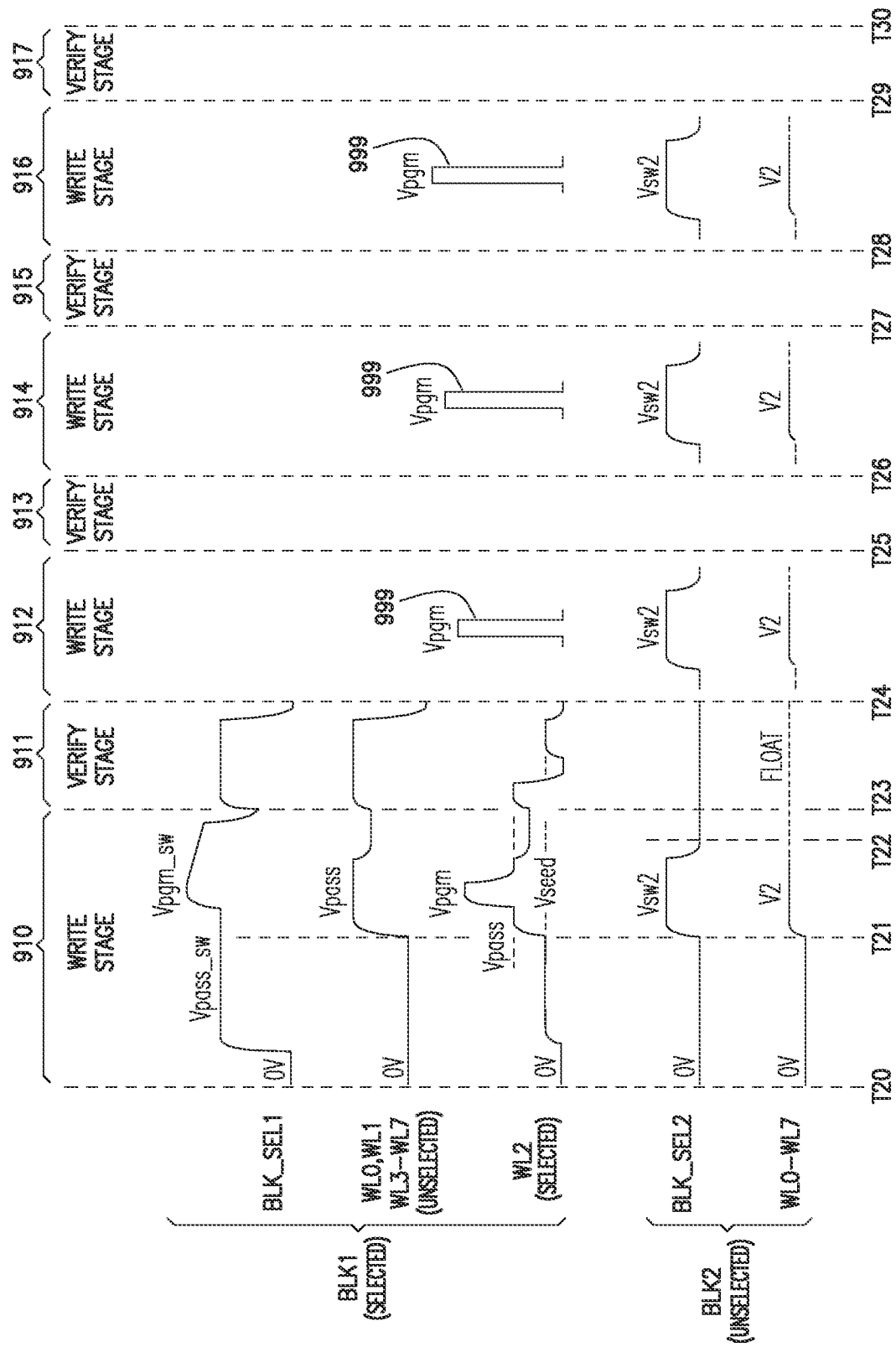
FIG. 9 shows another example write operation of the memory device of FIG. 5 and FIG. 6, according to some embodiments described herein.

FIG. 9 shows another example write operation of the memory device of FIG. 5 and FIG. 6, according to some embodiments described herein. Memory device 200 can be configured to perform either the write operation associated with FIG. 8 or the write operation associated with FIG. 9. For simplicity, similar or the same elements between FIG. 8 and FIG. 9 are not repeated. In FIG. 9, like the example of FIG. 8, memory block BLK1 is assumed to be a selected memory block to store information in a selected memory cell of memory block BLK1. Memory block BLK2 and other memory blocks (e.g., memory blocks BLK1 and BLK3) are unselected memory blocks.

As shown in FIG. 9, the write operation of storing information in selected memory cell of memory block BLK1 can include different stages (e.g., different operations) between times T20 and T30. The stages include example numbers of write stages 910, 912, 914, and 916, and verify stages 911, 913, 915, and 917.

In the example of FIG. 9, signal BLK_SEL2 can be provided with a voltage Vsw2 to turn on transistors T of string driver 342 (FIG. 6) to apply voltage V2 to diffusion regions D2 associated with signals WL0 through WL7 of memory block BLK2. As shown in FIG. 9, signal BLK_SEL2 can be activated (e.g., can be provided with voltage Vsw2) in a write stage (e.g., write stages 910, 912, 914, and 916) after voltage Vseed is applied to diffusion regions D1 associated with signal WL2 in memory block BLK1 in the write stage.

Applying a voltage V2 in FIG. 9 to a diffusion region (e.g., diffusion regions D2 in this example) associated with an unselected memory block (e.g., memory block BLK2) in the structures of string drivers 340, 341, 342, and 343 of memory device 200 can provide improvements and benefits discussed above with reference to FIG. 7.

Memory device 200 can perform a verify stage (e.g., verify stages 911, 913, 915, and 917) after each write stage. Memory device 200 can repeat the write stage and the verify stage if needed. As shown in FIG. 8, pulse 999 can have different voltage values (e.g., different amplitudes) each time the write stage is repeated. The example write operation associated with FIG. 9 can end after time T30 at which the selected memory cells reach respective target states.

Memory device 200 can skip applying voltage V2 to diffusion regions D2 based on some conditions configured in memory device 200. The conditions can be the same as the conditions used in FIG. 8. For example, memory device 200 can skip applying voltage V2 if the number of pulses 999 is not greater than a pulse number limit or if the value of voltage Vpgm is not greater than a voltage limit. Performing write operation in memory device 200 like the example associated with FIG. 9 can further improve performance (e.g., shorten program time) of memory device 200 in comparison to the write operation associated with FIG. 8.

Operating a write operation as described above with reference to FIG. 9 (e.g., applying voltage V2 to a diffusion region D2 associated with memory block BLK2 (unselected memory block)) can allow memory device 200 to have improvements and benefits discussed above with reference to FIG. 7.

FIG. 10 shows another example write operation of the memory device of FIG. 5 and FIG. 6, according to some embodiments described herein. The example write operation associated with FIG. 10 can be a variation of the example write operation of FIG. 9. Memory device 200 can be configured to perform either the write operation associated with FIG. 8, FIG. 9, or FIG. 10. For simplicity, similar or the same elements between FIG. 9 and FIG. 10 are not repeated.

As shown in FIG. 10, the write operation of storing information in a selected memory cell of memory block BLK1 can include different stages (e.g., different operations) between times T20 and T30. The stages include example numbers of write stages 910', 912', 914', and 916', and verify stages 911', 913', 915', and 917' that can be similar to numbers of write stages 910, 912, 914, and 916, and verify stages 911, 913, 915, and 917, respectively, of FIG. 9. Differences between the write operations associated with FIG. 9 and FIG. 10 include the voltages applied to the diffusion regions D1 and D2 associated with signals WL0 through WL7 of memory blocks BLK1 and BLK2 between times T20B and T21 in FIG. 10.

As shown in FIG. 10, signal BLK_SEL2 can be applied with voltage Vsw3 between times T20B and T21 to turn on transistors T of string driver 342 (FIG. 6) to apply voltage V3 to diffusion regions D2 associated with signals WL0 through WL7 of memory block BLK2. Between times T20B and T21, signal BLK_SEL1 can be applied with voltage Vpass_sw to turn on transistors T of string driver 341 (FIG. 6) to apply voltage V3' to diffusion regions D1 associated with signals WL0 through WL7 of memory block BLK1. The values of voltage V3' can be equal to (or approximately equal to) the value of voltage V3. Voltage V3 and V3' can be equal to (or approximately equal to) the supply voltage (e.g., Vcc) of memory device 200. Performing write operation in memory device 200 like the example associated with FIG. 10 can avoid or reduce potential current leakage been the word lines associated with signals WL0 through WL7 of memory block BLK2 that are coupled to diffusion regions D1 and D2.

Operating a write operation as described above with reference to FIG. 10 (e.g., applying voltage V3 to a diffusion regions D2 associated with memory block BLK2 (unselected memory block)) can allow memory device 200 to have improvements and benefits discussed above with reference to FIG. 7.

FIG. 11 is flowchart showing a method 1100 for performing a write operation in a memory device, according to some embodiments described herein. Method 1100 can be part of an algorithm included in the memory device (e.g., in a control unit of the memory device, like control unit 118 of FIG. 1). Method 1100 can be performed by software, firmware, hardware (e.g., logic circuitry), or any combination of software, firmware, and hardware. The software, firmware, hardware can be configured (e.g., can be included) in the memory device.

Method 1100 can include performing the write operation to store information in selected memory cells of a selected memory cell block among memory cell blocks of a memory array of the memory device. The memory device used in method 1100 can include the memory devices (e.g., memory devices 100, 200, and 1420 (FIG. 14)). As shown in FIG. 11, method 1100 can include activities (e.g., operations) 1105, 1110, 1115, 1120, 1125, 1130, 1135, 1140, and 1145.

Method 1100 can start the memory operation at activity 1105, which can include selecting a memory block to store information (e.g., data) in a write operation. The selected memory block in method 1100 can be memory block BLK1 of memory device 200 (FIG. 2 through FIG. 10).

Activity 1110 can include performing an operation on an adjacent memory block, which is an unselected memory block adjacent the selected memory block. The adjacent memory block in method 1100 can be memory block BLK2 of memory device 200 (FIG. 2 through FIG. 10). The operation in activity 1110 can include applying a voltage to diffusion regions (e.g., diffusion regions D2) associated with the adjacent memory block. The voltage applied in activity 1110 can include voltage V1, V2, or V3 (FIG. 8, FIG. 9, and FIG. 10, respectively).

Activity 1115 can include performing a write stage (e.g., program stage) on the selected memory block to store information the selected memory block. The write stage can include the write stage of FIG. 8, FIG. 9, or FIG. 10. The write stage in activity 1115 can include applying a programming voltage (e.g., voltage Vpgm) to a selected word line of the selected memory block. The programming voltage can be provided by a pulse (e.g., a programing pulse). The pulse in activity 1115 can include pulse 888, 999, or 1010 (FIG. 8, FIG. 9, and FIG. 10, respectively). Information stored in a memory cell can correspond to the state of the memory cell. Activity 1115 can cause the selected memory cells to have respective states. The state in a memory cell can correspond to the threshold voltage of the memory cell. Each memory cell in the memory device used in method 1100 can store at most one bit per cell or multiple bits per cell. Thus, the state of the memory cell of the memory device in method 1100 can represent the value (e.g., binary value) of a single bit of information or the value of multiple bits.

Activity 1120 of method 1100 can include counting the number of pulses that have been used in activity 1115. The number of pulses used in activity 1115 can correspond to the number of pulse 888, pulse 999, or pulse 1010 described above with reference to FIG. 8, FIG. 9 and FIG. 10.

Activity 1125 can include performing a verify stage (e.g., program verify stage) of the write operation. The verify stage can include determining whether the selected memory cells reach their respective target states. A target state is a state corresponding to the value of information intended to be stored in a selected memory cell. The verify operation can include comparing the states (e.g., threshold voltages) of the selected memory cells with their respective target states (e.g., target threshold voltages).

Activity 1130 can include determining whether all selected memory cells reach their target states. Label "NO" at activity 1130 indicates that fewer than all (not all) selected memory cells reach (or are deemed to have reached) their target states. In this case, method 1100 can continue with activity 1140. The label "YES" at activity 1135 indicates that all selected memory cells have reached (or are deemed to have reached) their target states. In this case, method 1100 can continue with activity 1135.

Activity 1140 can include increasing the value of the programing voltage. For example, activity 1140 can increase the voltage (e.g., amplitude) of the pulse (e.g., pulse 888, 999, or 1010) used in activity 1115.

Activity 1145 can include determining whether the number of the pulses (e.g., pulse 888, 999 or 1010) used in activity 1115 is greater than (exceed) a limit (e.g., count limit). For example, activity 1145 can compare the number of pulses counted in activity 1120 with the limit. The limit described here can be a preset limit (e.g., predetermined value) that can be an adjustable value and can be stored (e.g., programmable) in the memory device. For example, a control unit of the memory device (like control unit 118 of FIG. 1) can include a register to store the value (e.g., a predetermined count value) of the limit.

Label "YES" at activity 1145 indicates that the number of pulses (used in activity 1115) is greater than the limit (exceed the limit). In this case, method 1100 can perform a repeat sequence (e.g., a repeat loop) to repeat some or all of activities 1110, 1115, 1120, 1125, 1130, 1140, and 1145 at least one more time in response to the result from activity 1130. Label "NO" at activity 1145 indicates that the number of pulses (used in activity 1115) is not greater than the limit (not exceed the limit). In this case, method 1100 can skip activity 1110 and perform activities 1115, 1120, 1125, 1130, and then repeat some or all of activities 1110, 1115, 1120, 1125, 1130, 1140, and 1145 at least one more time in response to the result from activity 1130.

Activity 1135 can include ending (completing) the write operation if all of the selected memory cells are deemed to reach their respective target states.

Method 1100 can provide improvements and benefits similar to those of memory device 200 described above reference to FIG. 2 through FIG. 10.

FIG. 12 is flowchart showing a method 1200 for performing a write operation in a memory device, according to some embodiments described herein. Method 1200 can be part of an algorithm included in the memory device (e.g., in a control unit of the memory device, like control unit 118 of FIG. 1). Method 1200 can be performed by software, firmware, hardware (e.g., logic circuitry), or any combination of software, firmware, and hardware. The software, firmware, hardware can be configured in (e.g., can be included in) the memory device.

Method 1200 can include performing the write operation to store information in selected memory cells of a selected memory cell block among memory cell blocks of a memory array of the memory device. The memory device used in method 1200 can include the memory devices (e.g., memory devices 100, 200, and 1420 (FIG. 14)). As shown in FIG. 12, method 1200 can include activities (e.g., operations) 1205, 1210, 1215, 1220, 1225, 1230, 1235, 1240, and 1245.

Method 1200 can start the memory operation at activity 1205, which can include selecting a memory block to store information (e.g., data) in a write operation. The selected memory block in method 1200 can be memory block BLK1 of memory device 200 (FIG. 2 through FIG. 10).

Activity 1210 can include determining whether a programming voltage (e.g., voltage Vpgm in FIG. 8, FIG. 9, and FIG. 10) used in a stage (e.g., write stage in activity 1120) is greater than (exceed) a limit (e.g., voltage limit). For example, activity 1210 can compare the value of the programming voltage with the limit. The limit described here can be a preset limit (e.g., predetermined value) that can be an adjustable value and can be stored (e.g., programmable) in the memory device. For example, a control unit of the memory device (like control unit 128 of FIG. 1) can include a register to store the value (e.g., a predetermined voltage value) of the limit.

Label "NO" at activity 1210 indicates that the value of the programming voltage is not greater than the limit (not exceed the limit). In this case, method 1200 can skip activity 1215 and perform activity 1220. Label "YES" at activity 1210 indicates that value of the programming voltage is greater than the limit (exceed the limit). In this case, method 1200 can continue with activity 1215.

Activity 1215 can include performing an operation on an adjacent memory block, which is an unselected memory block adjacent the selected memory block. The adjacent memory block in method 1200 can be memory block BLK2 of memory device 200 (FIG. 2 through FIG. 10). The operation in activity 1215 can include applying a voltage to diffusion regions (e.g., diffusion regions D2) associated with the adjacent memory block. The voltage applied in activity 1215 can include voltage V1, V2, or V3 (FIG. 8, FIG. 9, and FIG. 10, respectively).

Activity 1220 can include performing a write stage program (e.g., program stage) on the selected memory block to store information the selected memory block. The write stage can include the write stage of FIG. 8, FIG. 9, or FIG. 10. The write stage in activity 1220 can include applying the programming voltage (e.g., voltage Vpgm) to a selected control gate of the selected memory block. The programming voltage can be provided by a pulse (e.g., a programming pulse). The pulse in activity 1220 can include pulse 888, 999, or 1010 (FIG. 8, FIG. 9, and FIG. 10, respectively). Activity 1115 can cause the selected memory cells to have respective states. Thus, the state of the memory cell of the memory device in method 1200 can represent the value (e.g., binary value) of a single bit of information or the value of multiple bits.

Activity 1225 of method 1200 can include storing (e.g., updating) the value of the programming voltage in activity 1220. The value can be the most recent value of the programming voltage in activity 1220.

Activity 1230 can include performing a verify stage (e.g., program verify stage) of the write operation. The verify stage can include determining whether the selected memory cells reach their respective target states. The verify operation can include comparing the states (e.g., threshold voltages) of the selected memory cells with their respective target states (e.g., target threshold voltages).

Activity 1235 can include determining whether all selected memory cells reach their target states. Label "NO" at activity 1235 indicates that fewer than all (not all) selected memory cells reach (or are deemed to have reached) their target states. In this case, method 1200 can continue with activity 1245. The label "YES" at activity 1235 indicates that all selected memory cells reach (or are deemed to have reached) their target states. In this case, method 1200 can continue with activity 1240.

Activity 1245 can include increasing the value of the programing voltage. For example, activity 1245 can increase the voltage (e.g., amplitude) of the pulse (e.g., pulse 888, 999, or 1010) used in activity 1220.

After activity 1245 is performed, method 1200 can perform a repeat sequence (e.g., a repeat loop) to repeat some or all of activities 1210, 1215, 1220, 1225, 1230, 1235, and 1240 at least one more time in response to the result from activity 1135.

Activity 1240 can include ending (completing) the write operation if all of the selected memory cells are deemed to reach their respective target states.

Method 1200 can include other activities and operations of memory device 200 described above with reference to FIG. 2 through FIG. 10.

Method 1200 can provide improvements and benefits similar to those of memory device 200 described above reference to FIG. 2 through FIG. 10.

FIG. 13 is flowchart showing a method 1300 for performing a write operation in a memory device, according to some embodiments described herein. Method 1300 can be part of an algorithm included in the memory device (e.g., in a control unit of the memory device, like control unit 138 of FIG. 1). Method 1300 can be performed by software, firmware, hardware (e.g., logic circuitry), or any combination of software, firmware, and hardware. The software, firmware, hardware can be configured (e.g., can be included in) the memory device.

Method 1300 can include performing the write operation to store information in selected memory cells of a selected memory cell block among memory cell blocks of a memory array of the memory device. The memory device used in method 1300 can include the memory devices (e.g., memory devices 100, 200, and 1420 (FIG. 14)). As shown in FIG. 13, method 1300 can include activities (e.g., operations) 1305, 1310, 1315, 1320, 1325, 1330, 1335, 1340, 1345, 1350, and 1355.

Method 1300 can start the memory operation at activity 1305, which can include selecting a memory block to store information (e.g., data) in a write operation. The selected memory block in method 1300 can be memory block BLK1 of memory device 200 (FIG. 2 through FIG. 10).

Activity 1310 can include performing a write stage (e.g., program stage) on the selected memory block to store information the selected memory block. The write stage in activity 1310 can include applying a programming voltage (e.g., voltage Vpgm) to a selected control gate of the selected memory block. Programming voltage can be provided by a pulse (e.g., a programing pulse). Each memory cell in the memory device used in method 1300 can store at most one bit per cell or multiple bits per cell. Thus, the state of the memory cell of the memory device in method 1300 can represent the value (e.g., binary value) of a single bit of information or the value of multiple bits.

Activity 1315 can include performing a verify stage (e.g., program verify stage) of the write operation. The verify stage can include determining whether the selected memory cells reach their respective target states. A target state is a state corresponding to the value of information intended to be stored in a selected memory cell. The verify operation can include comparing the states (e.g., threshold voltages) of the selected memory cells with their respective target states (e.g., target threshold voltages).

Activity 1320 of method 1300 can include storing (e.g., updating) a fail count. The fail count can include a number of bits having respective values (e.g., threshold voltages) different from target states (e.g., target threshold voltage).

Activity 1325 can include determining whether all selected memory cells reach their target states. Label "NO" at activity 1325 indicates that fewer than all (not all) selected memory cells reach (or are deemed to have reached) their target states. In this case, method 1300 can continue with activity 1335. The label "YES" at activity 1325 indicates that all selected memory cells have reached (or are deemed to have reached) their target states. In this case, method 1300 can continue with activity 1330.

Activity 1330 can include completing the write operation with a pass status.

Activity 1335 can include determining whether a last programming pulse has been used in activity 1315. Label "NO" at activity 1335 indicates that the last programming pulse has not been used. In this case, method 1300 can continue with activity 1140. The label "YES" at activity 1335 indicates that the last programming pulse has been used. In this case, method 1300 can continue with activity 1345.

Activity 1345 can include determining whether a fail count (stored in activity 1320) is less than (does not exceed) a limit (e.g., fail count limit). For example, activity 1345 can compare the value of the fail count in activity 1320 with the limit. The limit described here can be a preset limit (e.g., predetermined value) that can be an adjustable value and can be stored (e.g., programmable) in the memory device. For example, a control unit of the memory device (like control unit 118 of FIG. 1) can include a register to store the value (e.g., a predetermined count value) of the limit. The value of the limit can be selected based on the capability of memory device correcting error bits (e.g., failed bits). For example, the memory device can correct information having up to M error bits, then the fail count can bet set at M (M bits).

Label "YES" at activity 1345 indicates that the fail count (in activity 1320) is less than the limit (e.g., less than M). In this case, method 1300 can perform activity 1350 to complete the write operation with a pass status. After activity 1350, method 1300 can perform an error correction (not shown) to correct the bits (e.g., failed bits) that have their value different from target values.

Label "NO" at activity 1345 indicates that the value of the fail count is not less than the limit (e.g., not less than M). In this case, method 1300 can perform activity 1355 to complete the write operation with a fail status.

Activity 1340 can include increasing the value of the programing voltage. For example, activity 1340 can increase the voltage (e.g., amplitude) of the pulse used to provide the programming voltage.

After activity 1340 is performed, method 1300 can perform a repeat sequence (e.g., a repeat loop) to repeat some of activities 1310, 1315, 1320, 1325, 1325, 1330, 1335, 1345, 1350, and 1355 at least one more time in response to the result from activity 1325.

Method 1300 can include other activities and operations of memory device 200 described above with reference to FIG. 2 through FIG. 10.

FIG. 14 shows an apparatus in the form of a system (e.g., electronic system) 1400, according to some embodiments described herein. Part of system 1400 or the entire system 1400 can include, or be included in, a system-on-chip, a system on package, a solid state drive (SSD), a cellphone, a tablet, a computer, an electronic module in an automobile, or other types of electronic systems. As shown in FIG. 14 system 1400 can include a processor 1410, a memory device 1420, a memory controller 1430, a graphics controller 1440, an I/O controller 1450, a display 1452, a keyboard 1454, a pointing device 1456, at least one antenna 1458, a connector 1415, and a bus 1460 (e.g., conductive lines formed on a circuit board (not shown) of system 1400).

In some arrangements, system 1400 does not have to include a display. Thus, display 1452 can be omitted from system 1400. In some arrangements, system 1400 does not have to include any antenna. Thus, antenna 1458 can be omitted from system 1400.

Each of processor 1410, memory device 1420, memory controller 1430, graphics controller 1440 and I/O controller 1450 can include a die and can be part of an IC package.

Processor 1410 can include a general-purpose processor or an application-specific integrated circuit (ASIC). Processor 1410 can include a central processing unit (CPU).

Memory device 1420 can include a dynamic random-access memory (DRAM) device, a static random-access memory (SRAM) device, a flash memory device (e.g., NAND flash memory device), phase change memory, a combination of these memory devices, or other types of memory.

In an example, memory device 1420 can include memory device 100 or 200 described above with reference to FIG. 1 through FIG. 13. Thus, memory device 1420 can include the structure of the memory devices (e.g., memory device 100 or 200) and memory operations (e.g., the write operation) described above with reference to FIG. 1 through FIG. 13. In FIG. 14, processor 1410 or memory controller 1430 can communicate with memory device 1420 to cause memory device 1420 to perform memory operations described above with reference to FIG. 1 through FIG. 13. For example, processor 1410 or memory controller 1430 can send instructions (e.g., commands in the form of signals) to memory device 1420 to cause memory device 1420 to perform a write, read, or erase operation. The write operation can include any of the write operations described above with reference to FIG. 1 through FIG. 13.

Display 1452 can include a liquid crystal display (LCD), a touchscreen (e.g., capacitive or resistive touchscreen), or another type of display. Pointing device 1456 can include a mouse, a stylus, or another type of pointing device.

I/O controller 1450 can include a communication module for wired or wireless communication (e.g., communication through one or more antennas 1458). Such wireless communication may include communication in accordance with WiFi communication technique, Long Term Evolution Advanced (LTE-A) communication technique, or other communication techniques.

I/O controller 1450 can also include a module to allow system 1400 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 1415 can be arranged (e.g., can include terminals, such as pins) to allow system 1400 to be coupled to an external device (or system). This may allow system 1400 to communicate (e.g., exchange information) with such a device (or system) through connector 1415. Connector 1415 may be coupled to I/O controller 1450 through a connection 1416 (e.g., a bus).

Connector 1415, connection 1416, and at least a portion of bus 1460 can include elements (e.g., conductive terminals, conductive lines, or other conductive elements) that conform with at least one of USB, DP, HDMI, Thunderbolt, PCIe, Ethernet, and other specifications.

FIG. 14 shows the elements (e.g., devices and controllers) of system 1400 arranged separately from each other as an example. In some arrangements, two or more elements of system 1400 can be located on the same IC package, same subsystem, or same device. For example, memory device 1420 and memory controller 1430 can be included in the same SSD or same memory sub-system of system 1400.

The illustrations of apparatuses (e.g., memory devices 100, 200 and 1420) and methods (e.g., method of operating devices 100, 200, and 1420) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 1420) or a system (e.g., a computer, a cellular phone, or other electronic systems) that includes a device such as any of memory devices 100, 200, and 1420.

Any of the components described above with reference to FIG. 1 through FIG. 14 can be implemented in a number of ways, including simulation via software. Thus, apparatuses, e.g., memory devices 100, 200, and 1420, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, and 1420 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audios players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 14 include apparatuses, and methods of forming the apparatuses. One of the apparatuses includes a first memory block including first control gates for respective first memory cells of the first memory block; a second memory block including second control gates for respective second memory cells of the second memory block; first diffusion regions coupled to the first control gates; second diffusion regions adjacent the first diffusion regions, the second diffusion regions coupled to the second control gates; and a circuit to apply a voltage to the second diffusion regions in a write operation performed on the first memory block. Other embodiments including additional apparatuses and methods are described.

In the detailed description and the claims, the term "on" used with respect to two or more elements (e.g., materials), one "on" the other, means at least some contact between the elements (e.g., between the materials). The term "over" means the elements (e.g., materials) are in close proximity, but possibly with one or more additional intervening elements (e.g., materials) such that contact is possible but not required. Neither "on" nor "over" implies any directionality as used herein unless stated as such.

In the detailed description and the claims, the terms "first", "second", and "third," etc. are used merely as labels, and are not intended to impose numerical requirements on their objects.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
a first memory block including first word lines for respective first memory cells;
a second memory block including second word lines for respective second memory cells;
first transistors sharing a first gate, the first transistors including first diffusion regions coupled to the first word lines, respectively;
second transistors sharing a second gate, the second transistors including second diffusion regions coupled to the second word lines, respectively, the second diffusion regions being adjacent the first diffusion regions;
a circuit to couple the second gate to a first voltage for a time interval in a write operation of storing information in the first memory cells, and decouple the second gate from the first voltage after the time interval; and
an additional circuit to couple the first gate to a second voltage in the write operation, wherein the circuit is configured to couple the second gate to the first voltage before the first gate is coupled to the second voltage.

2. The apparatus of claim 1, further comprising:
third diffusion regions adjacent the first diffusion regions; and
fourth diffusion regions adjacent the second diffusion regions.

3. The apparatus of claim 2, further comprising:
a first conductive line coupled to respective diffusion regions of the third diffusion regions and respective diffusion regions of the fourth diffusion regions.

4. The apparatus of claim 1, wherein the first diffusion regions and the second diffusion regions have a same material.

5. The apparatus of claim 1, wherein the first memory block is adjacent the second memory block.

6. The apparatus of claim 1 further comprising:
a third memory block including third word lines for respective third memory cells;
third transistors sharing a third gate, the third transistors including third diffusion regions coupled to the third word lines, respectively; and
the third transistors sharing respective diffusion regions with the first transistors.

7. The apparatus of claim 6 further comprising:
a fourth memory block including fourth word lines for respective fourth memory cells;
fourth transistors sharing a fourth gate, the fourth transistors including fourth diffusion regions coupled to the fourth word lines, respectively; and the fourth transistors sharing fourth diffusion regions with the second transistors.

8. A method comprising:
performing a write operation on a memory array, the memory array including a first memory block and a second memory block, and performing the write operation including:
selecting the first memory block to store information, the first memory block coupled to first diffusion regions; and
applying a voltage to second diffusion regions, the second diffusion regions being adjacent the first diffusion regions and coupled to the second memory block, wherein performing the write operation includes:
applying a first additional voltage to third diffusion regions adjacent the second diffusion regions;
refraining from applying a second additional voltage to fourth diffusion regions while the voltage is applied to the second diffusion regions, the fourth diffusion regions being adjacent the third diffusion regions; and
the third diffusion regions are between the fourth diffusion regions.

9. The method of claim 8, wherein performing the write operation includes:
applying additional voltages to the first diffusion regions during a write stage of the write operation;
stopping the applying the voltage to the second diffusion regions;
verifying whether selected memory cells in the first memory block reach respective target states; and
repeating the applying the voltage to the second diffusion regions after verifying whether the selected memory cells in the first memory block reach the respective target states.

10. The method of claim 8, wherein the voltage applied to the second diffusion regions has a range from two volts to four volts.

11. A method comprising:
performing a write operation on a memory array, the memory array including a first memory block and a second memory block, and performing the write operation including:
selecting the first memory block to store information, the first memory block coupled to first diffusion regions; and
applying a voltage to second diffusion regions, the second diffusion regions being adjacent the first diffusion regions and coupled to the second memory block, wherein performing the write operation includes applying an additional voltage to at least one of the first diffusion regions, respectively, after the voltage is applied to the second diffusion regions.

12. The method of claim 11, further comprising:
stopping the applying the voltage to the second diffusion regions while the additional voltage is applied to the at least one of the first diffusion regions.

13. The method of claim 11, wherein the additional voltage applied to at least one of the first diffusion regions is greater than the voltage applied to the second diffusion regions.

14. A method comprising:
performing a write operation on a memory array, the memory array including a first memory block and a second memory block, and performing the write operation including:
selecting the first memory block to store information, the first memory block coupled to first diffusion regions; and
applying a voltage to second diffusion regions, the second diffusion regions being adjacent the first diffusion regions and coupled to the second memory block, wherein performing the write operation includes applying an additional voltage to at least one of the first diffusion regions, respectively, before the voltage is applied to the second diffusion regions.

15. The method of claim 14, wherein the additional voltage to at least one of the first diffusion regions is less than the voltage applied to the second diffusion regions.

16. A method comprising:
performing a write operation on a memory array, the memory array including a first memory block, and a second memory block adjacent the first memory block, and write operation including:
selecting the first memory block to store information, the first memory block associated with first diffusion regions coupled to respective first word lines for respective first memory cells of the first block; and
applying a voltage to second diffusion regions, the second diffusion regions being adjacent the first diffusion regions, the second diffusion regions coupled to respective second word lines for respective second memory cells of the second block, wherein performing the write operation includes:
applying an additional voltage to at least one of the first diffusion regions, respectively, before or after the voltage is applied to the second diffusion regions.

17. The method of claim 16, wherein one of the additional voltages includes a programming voltage.

18. The method of claim 16, wherein performing the write operation includes:
stopping the applying the voltage to the second diffusion regions;
verifying whether selected memory cells in the first memory block reach respective target states; and
repeating the applying the voltage to the second diffusion regions after verifying whether the selected memory cells in the first memory block reach the respective target states.

* * * * *